(12) United States Patent
Edel

(10) Patent No.: US 6,984,979 B1
(45) Date of Patent: Jan. 10, 2006

(54) MEASUREMENT AND CONTROL OF MAGNETOMOTIVE FORCE IN CURRENT TRANSFORMERS AND OTHER MAGNETIC BODIES

(76) Inventor: Thomas G. Edel, 9232 N. Tyler Ave., Portland, OR (US) 97203-2356

( * ) Notice: Subject to any disclaimer, the term of this patent is extended or adjusted under 35 U.S.C. 154(b) by 282 days.

(21) Appl. No.: 10/356,133

(22) Filed: Feb. 1, 2003

(51) Int. Cl.
G01R 33/04 (2006.01)

(52) U.S. Cl. .................. 324/253; 324/260; 324/263

(58) Field of Classification Search ............. 324/258, 324/117 R, 117 H, 127, 254, 225, 260, 207.18; 323/357; 340/870.33; 33/361; 361/143, 361/146
See application file for complete search history.

(56) References Cited

U.S. PATENT DOCUMENTS

| | | | | |
|---|---|---|---|---|
| 1,524,285 A | * | 1/1925 | Besag | 324/117 R |
| 2,047,609 A | * | 7/1936 | Antranikian | 33/301 |
| 2,053,154 A | * | 9/1936 | La Pierre | 324/99 R |
| 2,428,613 A | * | 10/1947 | Boyaiian | 307/7 |
| 3,007,106 A | * | 10/1961 | Bergh | 324/127 |
| 3,384,810 A | | 5/1968 | Kelsey | |
| 3,708,749 A | | 1/1973 | Bateman et al. | |
| 3,714,548 A | | 1/1973 | Macrander | |
| RE28,851 E | * | 6/1976 | Milkovic | 323/357 |
| 4,027,235 A | | 5/1977 | Macrander et al. | |
| 4,059,796 A | * | 11/1977 | Rhodes | 324/253 |
| 4,064,449 A | | 12/1977 | Macrander | |
| 4,255,704 A | | 3/1981 | Milkovic | |
| 4,255,705 A | | 3/1981 | Milkovic | |
| 4,274,052 A | * | 6/1981 | Gentry et al. | 324/117 R |
| 4,278,940 A | | 7/1981 | Milkovic | |
| 4,314,200 A | * | 2/1982 | Marek | 324/117 R |
| 4,847,554 A | | 7/1989 | Goodwin | |
| 5,019,697 A | * | 5/1991 | Postman | 235/441 |
| 5,091,697 A | * | 2/1992 | Roth et al. | 324/253 |
| 5,124,648 A | * | 6/1992 | Webb et al. | 324/253 |
| 6,160,697 A | * | 12/2000 | Edel | 361/143 |
| 6,380,735 B1 | * | 4/2002 | Kawakami | 324/253 |

OTHER PUBLICATIONS

Sonada, An ac and dc Current sensro of High Accuracy, Oct. 1992, IEEE vol. 28, pp. 1067-1094.*

(Continued)

*Primary Examiner*—Bot Ledynh
*Assistant Examiner*—Reena Aurora

(57) ABSTRACT

A magnetic body having nonlinear permeability is influenced by a magnetomotive force, the magnitude of which is to be measured or controlled. An electric energy source is connected to a winding that is magnetically coupled to the magnetic body. The electric energy source generates an oscillating output so as to cause the magnetic flux within the magnetic body to oscillate at a predetermined frequency. The oscillating flux is associated with an exciting current and excitation voltage, both oscillating at the predetermined frequency. The nonlinear permeability of the magnetic body causes the waveform of the exciting current to have different symmetry than the waveform of the excitation voltage. The difference of symmetry is indicative of the polarity and average value of magnetomotive force experienced by the magnetic body. The difference in symmetry is used to measure the average magnetomotive force experienced by the magnetic body. Alternatively the difference in symmetry may be used as an input to a control system that controls the average magnetomotive force experienced by the magnetic body. When applied to current transformers, the invention enables ordinary current transformers to operate with a-c and d-c primary currents while coupling very little noise to the primary circuit.

40 Claims, 11 Drawing Sheets

OTHER PUBLICATIONS

Yoshida et al., Precise current sensor by means of small angle magnetization rotataion using amorphous wire and its industrial application, Nov. 1993, IEEE vol. 29, pp. 3180-3182.*

Suzuki, Analysis of a zero-flux type current sensor, Nov. 1993, IEEE vol 29, pp. 3183-3185.*

Pejovic, A simple circuit for direct current measurement utilizing a transformer, Aug. 1998, IEEE vol. 45, pp. 830-837.*

LEM information Brochure, May 1999, pp. 20-24.

* cited by examiner

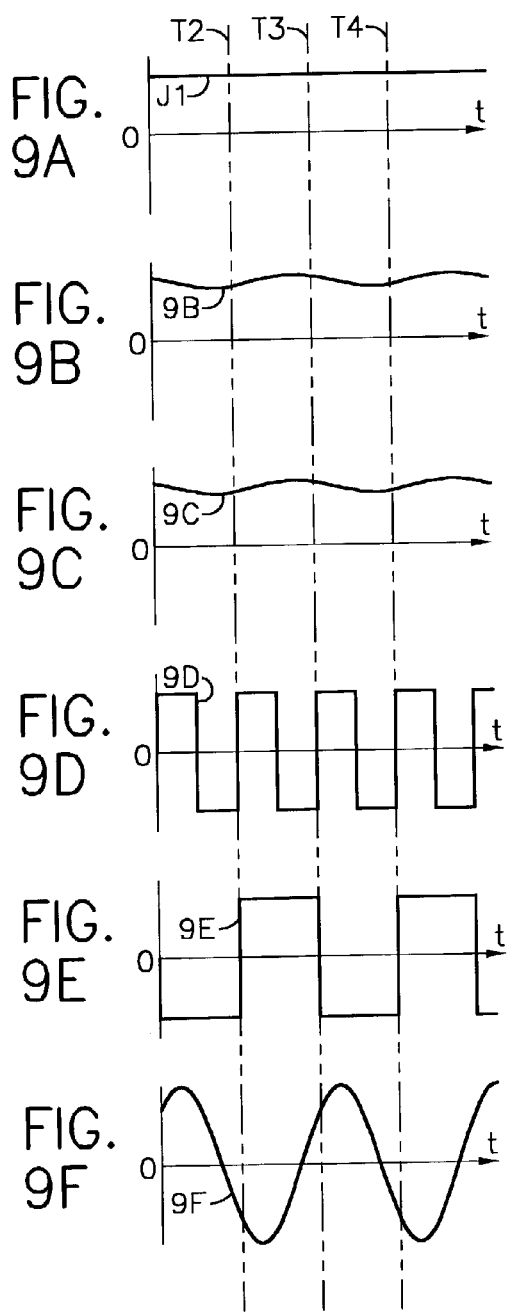
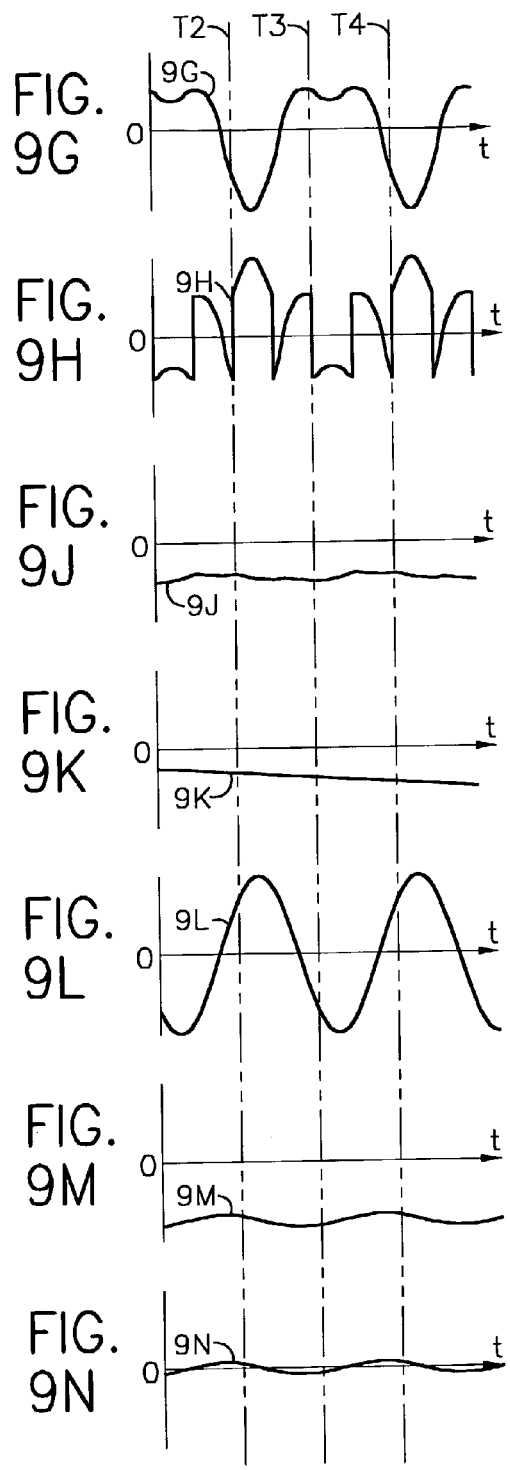

MEASUREMENT AND CONTROL OF MAGNETOMOTIVE FORCE IN CURRENT TRANSFORMERS AND OTHER MAGNETIC BODIES

CROSS-REFERENCE TO RELATED APPLICATION

Not Applicable

STATEMENT REGARDING FEDERALLY SPONSORED RESEARCH

Not Applicable

REFERENCE TO A MICROFICHE APPENDIX

Not Applicable

BACKGROUND OF THE INVENTION

This invention relates to the measurement and control of magnetomotive forces that influence magnetic fluxes in magnetic bodies. When applied to current transformers, the invention relates to the measurement of electric current, especially electric current that has a d-c (direct-current) component.

Magnetomotive force (F) is associated with the art of magnetic circuits, and is often defined for a closed loop as the line integral of the magnetic field strength (H) around the closed loop:

$$F = \oint H \cdot dl$$

Magnetomotive force F is a scalar quantity associated with the closed loop, while magnetic field strength H is a vector quantity. By Ampere's Law, magnetomotive force is proportional to the total current flowing through the closed loop. Utilizing the meter-kilogram-second (m.k.s.) system of units, magnetomotive force has units of amperes (or amp-turns), and is equal to the total current flowing through the closed loop. The closed loop is often chosen to pass through one or more conductive windings wrapped around a magnetic body, and a magnetomotive force equal to the current in the winding times the number of winding turns is associated with each winding (thus the unit "amp-turns"). The total magnetomotive force for the closed loop is the sum of all amp-turn contributions from all windings and other conductors.

Many magnetic devices operate best with an average magnetomotive force near zero. A deviation away from zero often results in excessive buildup of magnetic flux that causes the device to malfunction. Ordinary current transformers are one type of device for which this is usually the case. Since an understanding of current transformer operation is important to understanding some embodiments of the invention, the background of current transformers will be discussed in some detail. However, it should be kept in mind that the invention is applicable to many different kinds of magnetic devices, and is not limited to current measurement applications.

Most current monitoring systems for a-c (alternating-current) electric power systems utilize ordinary current transformers to provide input currents that are isolated from the electric power system conductors, similar to FIG. 1. A current-carrying conductor 4 is configured as a primary winding of a current transformer CT1, and is magnetically coupled to a magnetic core 1. For clarification, the term "magnetic core" as used herein refers to a magnetic body having a defined relationship with one or more conductive windings. A secondary winding 2 is also magnetically coupled to magnetic core 1. The phrase "magnetically coupled" is intended to mean that flux changes in a magnetic body are associated with an induced voltage in the winding, the induced voltage being proportional to the rate of change of magnetic flux that is coupled, in accordance with Faraday's Law.

A secondary electric current J2 is induced in the secondary winding that is proportional to a primary electric current J1. The secondary current is isolated from the primary current and is smaller than the primary current by the turns ratio of the primary and secondary windings. The primary winding may consist of only one turn (as in FIG. 1) or may have multiple turns wrapped around the magnetic core. The secondary winding usually consists of multiple turns wrapped around the magnetic core.

The accuracy of a current transformer is usually related to the coercive force of the magnetic core material (less is better), the cross sectional area of the magnetic core (bigger is better), the effective magnetic length of the magnetic core (shorter is better), any air gap in the magnetic core (less or none is better), and the "squareness" of the magnetic core material hysteresis curve (squarer may be preferred if not operating near saturation, otherwise characteristics that are not square may be preferred). Split-core current transformer cores generally have hysteresis curves that are less square than standard current transformer cores due to the small air gaps inherent in the design of split-core current transformers.

In order for the secondary current generated by a current transformer to be an accurate representation of the primary current, the impedance of the circuit connected to the secondary winding must be kept low so that current can flow freely. The impedance of the secondary circuit is often called the "burden." The burden generally includes all impedances in the loop through which the secondary current flows, including stray winding impedances, stray impedances of connecting conductors, and the impedances of any devices connected in the loop (such as current-sensing resistors and relay operating coils). In order for a current transformer to drive a secondary current through a non-zero burden, a voltage must be induced in the secondary winding. The induced voltage is proportional to secondary current and is proportional to the burden, in accordance with Ohm's Law (the induced voltage equals the secondary current times the vector sum of all secondary loop impedances). The induced voltage is induced in the secondary winding by a fluctuating magnetic flux in the magnetic core (the instantaneous magnitude of induced voltage being proportional to the rate of change of magnetic flux, in accordance with Faraday's Law). The fluctuating magnetic flux is associated with an "exciting current" in accordance with well-known electromagnetic principles. The exciting current is often understood to have a magnetizing component and a core loss component. When utilized to measure alternating current with no d-c component, the exciting current accounts for the error in the secondary current, and may be referred to herein as an "exciting current error." Generally speaking, the accuracy of a current transformer is inversely related to the burden of the secondary circuit. A higher burden causes the current transformer to operate with greater induced voltage, thereby increasing the exciting current error, thereby causing the secondary current to be less accurately proportional to the primary current.

With preferred current transformer operation, the amp-turns of the primary winding are largely canceled by the amp-turns of the secondary winding, so that the magnetomotive force acting on the current transformer core is relatively small. The net magnetomotive force acting on the core is equal to the difference in amp-turns of the primary winding and the secondary winding, and this difference is proportional to a secondary current error.

Speaking more precisely of current transformer operation, a secondary electric current error is proportional to the magnetomotive force acting on the magnetic core. The instantaneous value of the magnetomotive force is equal to the instantaneous difference between the primary electric current multiplied by the number of turns of the primary winding and the secondary electric current multiplied by the number of turns of the secondary winding. The secondary electric current error comprises a d-c component and an a-c component; the d-c component will be referred to as a d-c current error, and the a-c component will be referred to as an exciting current error.

Ordinary current transformers work properly only with alternating primary current. When a d-c component is present in the primary current, normal current transformer operation cannot maintain a d-c component in the secondary circuit, and a large d-c current error results. This d-c current error correlates to a large d-c magnetomotive force applied to the magnetic core, which causes the magnetic core to saturate, thereby adversely affecting current transformer operation.

A great many variations to the basic current transformer circuit have been developed in the prior art to improve current transformer accuracy for various applications. Some of these are summarized here:

(a) Utilize an active load to sense current. An active load can have an effective burden of virtually zero Ohms, but this does not solve the problem of stray impedances contributing to the burden of the secondary circuit. The use of an active load to reduce current transformer burden is described in detail in U.S. Pat. No. Re. 28,851 to Milkovic (reissued 1976) for a "Current Transformer with Active Load Termination."

(b) FIG. 2 illustrates one form of a prior-art "zero-flux" current transformer. A sense winding 10 terminated in a high-impedance manner provides a voltage signal V4 that is proportional to the rate of change of magnetic flux. By amplifying this signal and applying it in series with the secondary winding, the effective burden of the entire secondary circuit is reduced to near zero ohms. Magnetic flux oscillations in the current transformer core are reduced to near zero, and the exciting current required is reduced to near zero, thereby making secondary current more accurately proportional to primary current. The amplifier essentially provides the driving voltage necessary to drive loop current through secondary loop impedances so that the current transformer core does not need to generate this voltage via a changing flux. Higher gains in the amplifier circuit contribute to increased accuracy and smaller flux changes, though excessively high gain typically leads to instability and associated oscillations. This device provides very good accuracy for measurement of a-c current, but it cannot measure d-c current.

(c) In order to measure d-c current (or combined a-c and d-c current), Hall-effect current sensors are often used. These sensors typically insert a Hall-effect magnetic field sensor in a current transformer core air gap. In "open loop" devices, the magnetic field strength is used to estimate the primary current directly. "Closed loop" devices utilize a zero-flux concept similar to that described for FIG. 2. However, instead of using a sense winding (as in FIG. 2), the Hall-effect element generates a voltage signal proportional to the magnetic field in the air gap. A high-gain amplifier circuit is used to drive secondary current to continuously nullify the magnetic field, which causes the secondary winding amp-turns to balance the primary winding amp-turns. This results in a secondary current that is proportional to the primary current. A current-sensing resistor in the secondary circuit normally provides a voltage signal that is proportional to secondary current. While these Hall-effect current sensors are widely used, their accuracy and stability over time are not adequate for many applications.

(d) FIG. 3 shows another prior-art circuit that operates in a near-zero-flux manner. This type of "burden-reducing" circuit is described in U.S. patent application Ser. No. 09/713,921, filing date Nov. 15, 2000, by Edel. This patent application in its entirety is hereby incorporated by reference into this disclosure.

The circuit shown in FIG. 3 uses the secondary current as an input to generate the compensation voltage required to drive secondary current. This circuit has the advantage of utilizing ordinary current transformers without the need for a sense winding or Hall-effect sensor. However, the circuit shown in FIG. 3 can only be used to measure a-c current, and it is difficult to compensate for secondary loop impedance changes due to temperature changes. The associated patent describes how the control circuit can be modified to enable accurate measurement of d-c current, but the method used is dependent on brief periodic reset pulses applied to the magnetic core, during which time current cannot be measured.

(e) Many specialized current transformers with multiple windings and/or multiple cores have been developed. Many of these transformers have excellent accuracy. However, most of these specialized transformers are prohibitively expensive for many applications. Some devices having simple magnetic cores drive the core in and out of saturation to measure d-c current, often causing excessive noise on the primary circuit.

It is therefore an object of the present invention to provide an economical current sensor with the following properties:

(a) Utilize an ordinary current transformer core.
(b) Provide for continuous measurement of a-c and d-c current.
(c) Have a high degree of stability over time and temperature.
(d) Have better accuracy than Hall-effect current sensors.
(e) Cause very little noise on the primary circuit.

Another object of the invention is to provide a way to measure magnetomotive force experienced by a magnetic body without utilizing a Hall-effect sensor. Other objects will become apparent from the description of the invention.

BRIEF SUMMARY OF THE INVENTION

An excitation means is connected to a winding that is magnetically coupled to a magnetic body. The magnetic body has nonlinear permeability and is influenced by a magnetomotive force. The excitation means generates an oscillating output so as to cause the magnetic flux within the magnetic body to oscillate at a predetermined frequency, preferably without causing the magnetic body to saturate.

The oscillating flux is associated with an exciting current oscillating at the same frequency, and an excitation voltage oscillating at the same frequency (the excitation voltage is the voltage induced in the winding by the oscillating flux). The waveforms of the exciting current and excitation voltage are not the same due to the nonlinear permeability of the magnetic body. A difference of symmetry between these two excitation waveforms is dependent on the magnitude and polarity of the magnetomotive force. The invention utilizes known relationships between the difference of symmetry and the magnetomotive force to calculate the magnetomotive force.

For example, the excitation means may be a voltage source providing an oscillating output voltage having a symmetrical waveform, resulting in an oscillating exciting current that is only symmetrical when magnetomotive force has an average magnitude near zero. The dissymmetry of the exciting current is indicative of the polarity and average value of magnetomotive force experienced by the magnetic body. The dissymmetry may be used to measure the average magnetomotive force experienced by the magnetic body. Alternatively the dissymmetry may be used to generate an information signal for use as an input to a control system that controls the average magnetomotive force experienced by the magnetic body.

The excitation means may also be a current source providing an oscillating symmetrical output current, resulting in an oscillating excitation voltage. In this case, the dissymmetry of the excitation voltage is indicative of the polarity and average value of magnetomotive force experienced by the magnetic body.

Waveform dissymmetry is characterized by the Fourier series of the waveform having even harmonic components of the fundamental frequency. The preferred embodiment measures the second harmonic component, and calculates average magnetomotive force magnitude and polarity from the magnitude and phase angle of the second harmonic component.

For some applications, a difference of symmetry between excitation waveforms may also be used to measure the polarity and average magnitude of magnetic flux or a magnetic field. The correlation between waveform symmetry and a magnetic flux, magnetic field, and magnetomotive force is dependent on the configuration of the magnetic body and the magnetic material comprising the magnetic body. A simple proportional correlation usually exists between magnetic field strength and magnetomotive force for magnetic bodies with uniform magnetic characteristics.

Since magnetomotive force may be proportional to a single electric current flowing in a single winding, the invention may be used to measure an electric current in a non contact manner (without a proportional secondary current flowing in a secondary winding).

The invention may also be used to enable an ordinary current transformer to be used with a primary current having a d-c component. A voltage device is connected in series with the secondary circuit of the current transformer. The voltage device generates an output voltage in series with the secondary circuit. A control circuit controls the output voltage so as to cause the magnetic flux within the core of the current transformer to oscillate at a predetermined frequency. The flux oscillation preferably has low magnitude and low frequency, thereby minimizing noise on the primary circuit. The flux oscillation is associated with a small exciting current of the same frequency. The dissymmetry of this exciting current is indicative of the polarity and average value of magnetomotive force experienced by the current transformer core. A nonzero average magnetomotive force is due to a d-c current error (the difference in the d-c amp-turns of the primary winding and the d-c amp-turns of the secondary winding). The exciting current dissymmetry is detected and used to adjust the output voltage of the voltage device so as to maintain the average value of magnetomotive force near zero. This minimizes the d-c current error, thereby enabling the current transformer to operate with d-c primary current.

For current transformer operation with mixed a-c and d-c current, the preferred embodiment controls the output voltage to minimize flux changes normally associated with alternating-current operation. Otherwise, the preferred flux oscillations at the predetermined frequency would be corrupted, thereby corrupting the exciting current signal and adversely affecting operation. The preferred embodiment for current measurement (FIG. 10 & FIG. 11) combines two prior-art compensation methods with sensing of average magnetomotive force. This embodiment automatically compensates for secondary loop impedance changes due to temperature and time, and has very good accuracy and stability.

Usually, it is an "average value" of magnetomotive force that is determined by the invention, since the flux oscillations required by the invention (at the predetermined frequency) are associated with an oscillation of magnetomotive force (also at the predetermined frequency, and proportional to the exciting current). These oscillations at the predetermined frequency are not usually included in the measurement of magnetomotive force. However, it is possible to add the magnetomotive force associated with the exciting current to the measurement and thereby obtain an information signal that instantaneously correlates to the instantaneous magnitude of magnetomotive force. The preferred embodiment, however, does not do this.

BRIEF DESCRIPTION OF THE DRAWINGS

FIG. 9A through FIG. 9L show waveforms associated with the control circuit of FIG. 7 and FIG. 8 (these waveforms are also applicable to some subsequent figures).

FIG. 9M shows a waveform associated with the control circuit of FIG. 10 and FIG. 11.

FIG. FIG. 9N shows a waveform associated with the circuit of FIG. 12.

FIG. 17 illustrates how current sources may be used in place of voltage sources, how an exciting means may utilize a dedicated winding separate from a control winding, how the invention may be applied to magnetic bodies other than magnetic cores of current transformers, and how a general-purpose Proportional plus Integral plus Derivative (PID) controller may be utilized with the invention.

DETAILED DESCRIPTION OF THE DRAWINGS

Figure 1:
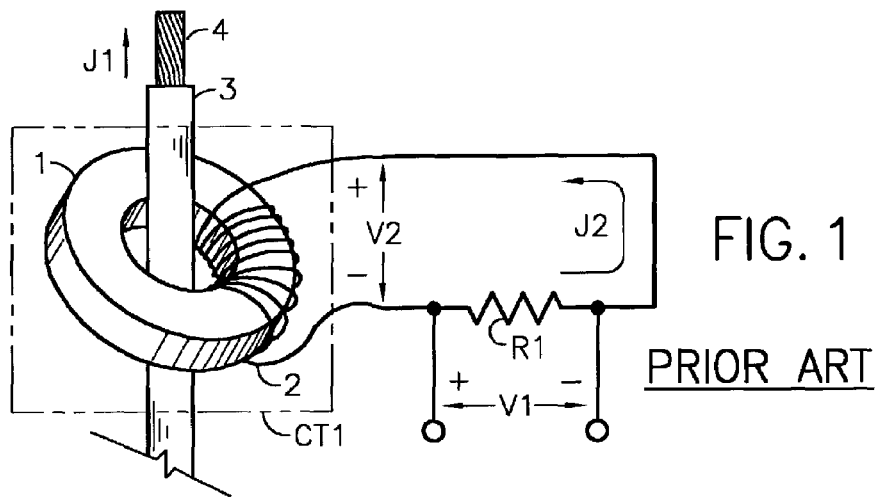
FIG. 1 illustrates a simple prior-art current transformer circuit that utilizes a current-sensing resistor to produce a voltage that is approximately proportional to primary current.

FIG. 1 illustrates a simple prior-art current measurement circuit. A current transformer CT1 comprises a magnetic core 1 and a secondary winding 2 magnetically coupled to the magnetic core. An electric power system conductor 4 with an insulating covering 3 is configured as a primary winding with only one turn, with a primary electric current J1 flowing. Though shown with one end disconnected, power system conductor 4 is normally connected as part of an electric power system. Though a toroid is shown for magnetic core 1, current transformers have many different kinds of magnetic cores. The number of winding turns shown for secondary winding 2 is for illustration only, and may vary widely depending on the particular application. Current transformers are also available with wound primary windings or with bar-type primary configurations.

A secondary electric current J2 is caused to flow by the transformer action of current transformer CT1 (in accordance with well-known current transformer principles). If current transformer CT1 were to have ideal properties, then secondary current J2 would be exactly (and instantaneously with no phase angle error) proportional to primary current J1, with magnitude reduced exactly by the turns ratio of the current transformer. However, since current transformers generally do not have ideal properties, there is an exciting current error in secondary current J2, and secondary current J2 is only approximately proportional to primary current J1.

In FIG. 1, a current-sensing resistor R1 with small resistance is connected in series with secondary winding 2 so that current J2 flows through resistor R1. A voltage signal V1 is the voltage across resistor R1, and is proportional to current J2. Since secondary current J2 is approximately proportional to primary current J1, voltage signal V1 is approximately proportional to primary current J1. Voltage signal V1 is often used as an input to a current monitoring system, energy meter, protective relay, or similar device.

Voltage V2 is the secondary winding voltage that is measurable at the terminals of secondary winding 2. Not taking into account stray impedances, in FIG. 1 voltage V2 is equal to voltage V1 in magnitude, and is opposite in polarity. Voltage V2 is generated by the current transformer as a result of changing magnetic flux associated with exciting current.

Figure 2:
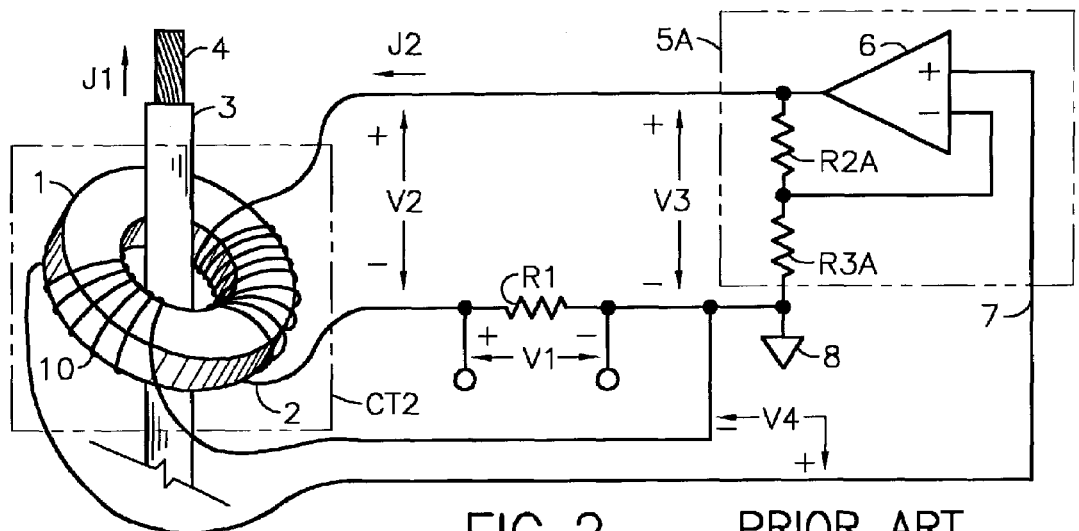
FIG. 2 illustrates a prior-art "zero-flux" current transformer circuit that utilizes a voltage device in the secondary circuit to improve accuracy for a-c current measurement applications. A sense winding 10 develops a voltage V4 that is proportional to the rate of change of magnetic flux in the magnetic core. This voltage is amplified and added in series with the secondary circuit so as to sharply reduce flux changes.

FIG. 2 illustrates a prior-art "zero-flux" current transformer circuit that utilizes a controllable voltage device 5A in the secondary circuit to improve accuracy for a-c current measurement applications. Though an operational amplifier circuit is shown, voltage device 5A may be any kind of device that can produce a controllable output voltage. A current transformer CT2 is similar to current transformer CT1 in FIG. 1, except that now a sense winding 10 is added to magnetic core 1. Sense winding 10 is terminated in a high-impedance manner and therefore has almost zero current flowing in it. With almost no current flowing, a voltage signal V4 that is generated across sense winding 10 is proportional to the rate of change of magnetic flux in the magnetic core (in accordance with Faraday's Law). Voltage signal V4 is connected to an operational amplifier 6 by a conductor 7. Resistors R2A and R3A are connected so as to control the gain of operational amplifier 6. The resistance of resistor R2A is selected to be much greater than resistor R3A so that the voltage gain of the amplifier is relatively large. Voltage V3 is the output voltage of the voltage device, and is simply voltage signal V4 amplified. Voltage V3 is connected in series with the secondary circuit, and provides most of the driving voltage required to drive current J2 through the secondary loop impedances. These loop impedances include resistor R1, stray winding resistance, stray winding reactance, and stray impedances of connecting wires. This sharply reduces flux changes in magnetic core 1, thereby sharply reducing the exciting current error, thereby making secondary current J2 more accurately proportional to primary current J1.

Figure 3:
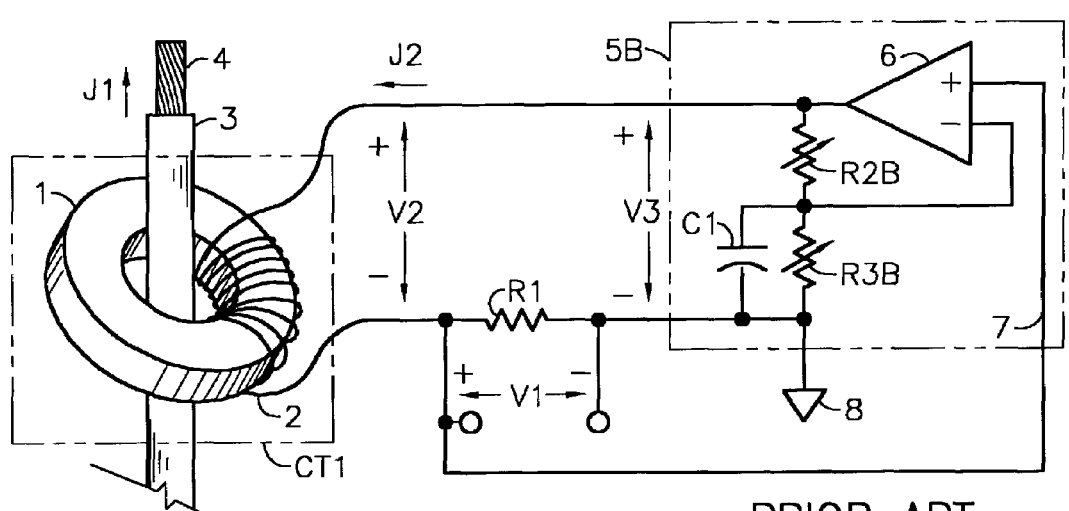
FIG. 3 illustrates another prior-art circuit that utilizes a voltage device in the secondary circuit to improve accuracy for a-c measurement applications. This circuit utilizes a signal that is proportional to secondary current to control the voltage device with a proportional plus derivative type of control. When properly adjusted, the voltage device provides most of the voltage necessary to drive secondary current through secondary loop impedances, thereby sharply reducing flux changes in the current transformer core.

FIG. 3 shows another prior-art circuit that operates in a near-zero-flux manner. This "burden-reducing" circuit uses the secondary current as an input to generate the compensation voltage required to drive secondary current. This circuit has the advantage of utilizing ordinary current transformers without the need for a sense winding or Hall-effect sensor.

Current transformer CT1 and current-sensing resistor R1 are the same as shown in FIG. 1. A controllable voltage device 5B produces an output voltage V3 similar to voltage device 5A of FIG. 2. In FIG. 3, voltage V3 is controlled based on voltage signal V1. Resistor R2B, Resistor R3B, and Capacitor C1 are configured to cause voltage V3 to have a component that is proportional to secondary current (which is proportional to voltage signal V1) and to have a component that is proportional to the rate-of-change of secondary current. The component that is proportional to secondary current provides the driving voltage required to drive secondary current through secondary resistances (such as resistor R1, winding resistance, and stray resistances of other conductors). The component that is proportional to the rate-of-change of secondary current provides the driving voltage required to drive secondary current through secondary reactive impedances (such as stray inductances in the secondary winding and other conductors). Resistors R2B and R3B are shown as variable to facilitate calibration for optimum operation. Adjusting resistor R3B calibrates for the ratio of secondary loop resistance to inductance, while adjusting resistor R2B adjusts the gain of the amplifier. For secondary circuits in which stray inductances are small, capacitor C1 may be omitted, in which case the gain of the amplifier should simply be set to a value slightly less than the total loop resistance divided by the resistance of R1.

Figure 4A:
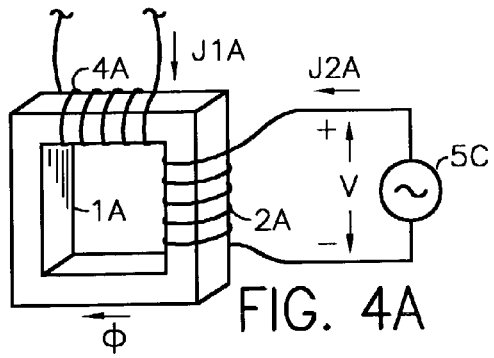
FIG. 4A shows a simple circuit that will be used to explain the fundamental principles of the invention.

FIG. 4A shows a simple magnetic circuit that will be used to explain how the invention utilizes nonlinearities of a magnetic body to measure the average value of a magnetomotive force. A magnetic body 1A having nonlinear permeability is magnetically coupled to a primary winding 4A and a secondary winding 2A. A d-c current J1A flowing in primary winding 4A produces a magnetomotive force in magnetic body 1A that is to be measured.

An oscillating excitation means 5C is connected to secondary winding 2A. Excitation means 5C may be configured as a voltage source (which produces a defined output voltage and allows output current to be dependent on the load) or a current source (which produces a defined output current, and allows the output voltage to be dependent on the load), or may be any kind of electric energy source capable of producing an oscillating output at a predetermined frequency.

For the present explanation, source 5C will be considered to be a voltage source that produces a sinusoidal output voltage V which oscillates at a predetermined frequency. This causes an exciting current J2A to flow, which also oscillates at the predetermined frequency. For simplicity of explanation, the effect of stray impedances will be considered negligible in the present discussion, so that voltage V is equal to the induced excitation voltage in winding 2A. The oscillating excitation voltage is associated with an oscillating magnetic flux Φ in magnetic core 1A. More specifically, the rate of change of flux Φ is proportional to voltage V (in accordance with Faraday's Law).

Figure 4B:
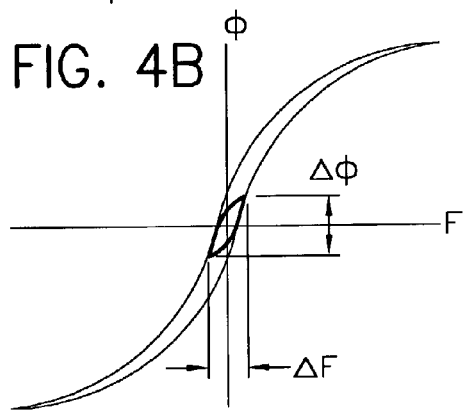
FIG. 4B through FIG. 6C show hysteresis curves and waveforms that illustrate how the invention utilizes nonlinearities of a magnetic core to measure magnetomotive force.

FIG. 4B shows a hysteresis curve for magnetic body 1A, applicable for the case of d-c current J1A initially being zero amps. The horizontal axis represents magnetomotive force F, and varies from negative values on the left to positive values on the right with a linear scale. The vertical axis represents magnetic flux Φ, and varies from negative values on the lower side to positive values above with a linear scale.

The hysteresis cycle associated with voltage V is shown bold, while a saturating hysteresis cycle is shown lighter. Voltage V causes flux to oscillate by an amount ΔΦ. This correlates with an oscillation of the magnetomotive force by an amount ΔF.

It should be noted that the excitation means preferably does not drive the magnetic body into saturation, so the magnitude of flux oscillations is preferably much smaller than saturation levels. The predetermined frequency may be any frequency that is suitable for a particular application and a particular magnetic body.

Figure 4C:
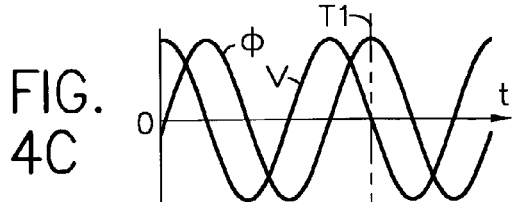
Figure 4D:
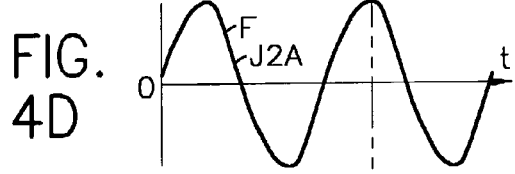
Figure 4E:
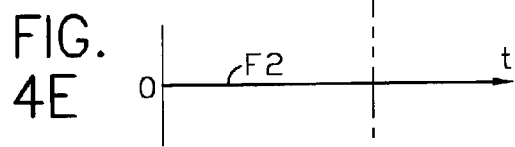

FIG. 4C through FIG. 4E show sample waveforms correlating to the hysteresis curve of FIG. 4B. A time reference T1 is included to facilitate comparison of waveform relationships. For each waveform, time t increases from left to right.

In FIG. 4C, Voltage V is shown as sinusoidal, which causes the waveform of flux Φ to be sinusoidal and lagging voltage V. The waveform of magnetomotive force F is shown in FIG. 4D, and, in this case, the waveform of exciting current J2A is the same as the waveform shown for magnetomotive force F (since current J1A is zero). Since magnetic body 1A has nonlinear characteristics, magnetomotive force F is seen to be distorted (not strictly sinusoidal). However, since the hysteresis characteristics of magnetic body 1A are symmetrical about the origin, the waveform of magnetomotive force F has half-wave symmetry.

Waveforms having half-wave symmetry satisfy the equation:

$$f(t) = -f(t \pm T/2)$$

where f(t) represents the repeating waveform as a function of time, and T is the time period of one cycle of the wave. With reference to well-known Fourier analysis techniques, it is known that waveforms having half-wave symmetry contain no even harmonic components of the fundamental frequency. FIG. 4E illustrates this, by showing the second harmonic F2 of magnetomotive force F to have a continuous magnitude of zero.

Figure 5A:
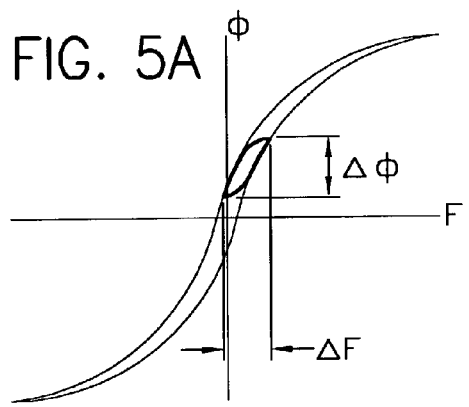

FIG. 5A shows another hysteresis curve for magnetic body 1A, applicable for the case of d-c current J1A having a positive magnitude. The hysteresis cycle associated with voltage V is shown bold, while a saturating hysteresis cycle is shown lighter. Voltage V still causes flux to oscillate by an amount ΔΦ. (The waveforms associated with flux Φ and voltage V are the same as shown in FIG. 4C.) The hysteresis loop is now offset from the origin due to the nonzero magnetomotive force associated with, current J1A. The hysteresis loop is now seen to be somewhat unsymmetrical, due to the nonlinear permeability of magnetic core 1A.

Figure 5B:
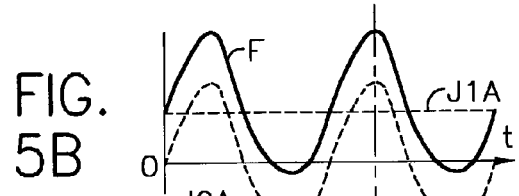
Figure 5C:
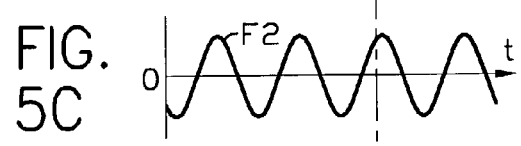

FIG. 5B shows the waveform of magnetomotive force F as the sum of magnetomotive forces associated with current J1A and exciting current J2A. Exciting current J2A no longer has half-wave symmetry, and therefore now contains even harmonic components of the predetermined frequency. FIG. 5C shows the waveform of the second harmonic component F2.

Figure 6A:
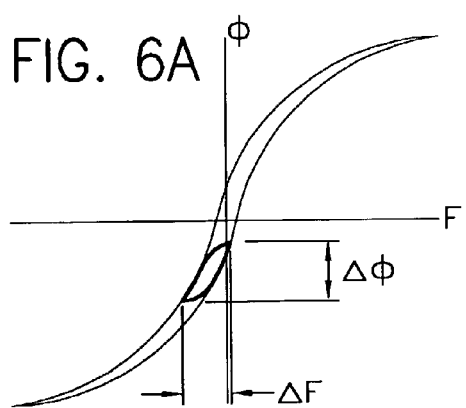

FIG. 6A shows another hysteresis curve for magnetic body 1A, applicable for the case of d-c current J1A having a negative magnitude. The hysteresis cycle associated with voltage V is shown bold, while a saturating hysteresis cycle is shown lighter. Voltage V still causes flux to oscillate by an amount ΔΦ. (The waveforms associated with flux Φ and voltage V are the same as shown in FIG. 4C.) The hysteresis loop is again offset from the origin due to the nonzero magnetomotive force associated with current J1A, but now in the opposite direction. The hysteresis loop is again seen to be unsymmetrical, due to the nonlinear permeability of magnetic core 1A.

Figure 6B:
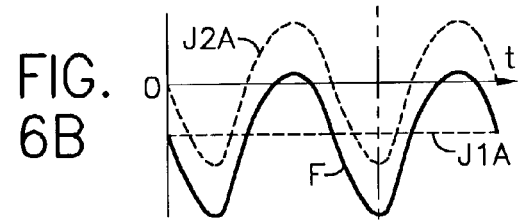
Figure 6C:
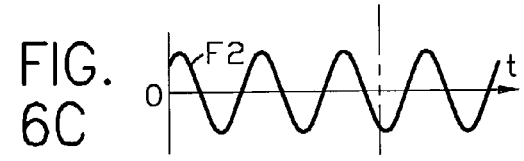

FIG. 6B shows the waveform of magnetomotive force F as the sum of magnetomotive forces associated with current J1A and exciting current J2A. Exciting current J2A again does not have half-wave symmetry, and therefore again contains even harmonic components of the predetermined frequency. FIG. 6C shows the waveform of the second harmonic component F2. The waveform in FIG. 6C is similar to the waveform in FIG. 5C, except that the phase angle is changed by 180 degrees (or the second harmonic could be considered to be inverted or have opposite polarity). This difference in phase angle of the second harmonic component is a known correlation used by the preferred embodiment to determine the polarity of the magnetomotive force. The magnitude of the second harmonic component has a known correlation to the magnitude of the magnetomotive force (as later discussed for FIG. 17), and is used by the preferred embodiment to determine the magnitude of the magnetomotive force.

The symmetry relationships illustrated in FIGS. 4C, 4D, 5B, and 6B are one example of how the invention may utilize predetermined symmetry relationships to measure magnetomotive force.

While voltage V has been shown as sinusoidal, the waveform is not critical. A sinusoidal waveform has been chosen to minimize noise. A symmetrical waveform is preferred so that a difference of symmetry between the excitation voltage waveform and the exciting current waveform is easily detectable.

The invention can also utilize a current source for exciting means 5C in FIG. 4A. With a current-source configuration, the current source preferably drives a symmetrical oscillating exciting current, and an unsymmetrical excitation voltage results. The dissymmetry of the excitation voltage is sensed in a manner that is similar to sensing the dissymmetry of unsymmetrical exciting current (as described for FIGS. 5A through 6C).

In general, excitation means 5C can be any kind of electric energy source capable of producing an oscillating output at a predetermined frequency. In the general case of an output signal that may not have a symmetrical waveform, then the exciting current is characterized by a first waveform, and the excitation voltage is characterized by a second waveform, and a difference of symmetry between the two waveforms is dependent on the magnitude and polarity of the magnetomotive force and the nonlinear permeability of the magnetic body. By utilizing predetermined symmetry relationships, the magnetomotive force may be determined from characteristics of one or both waveforms.

Figure 7:
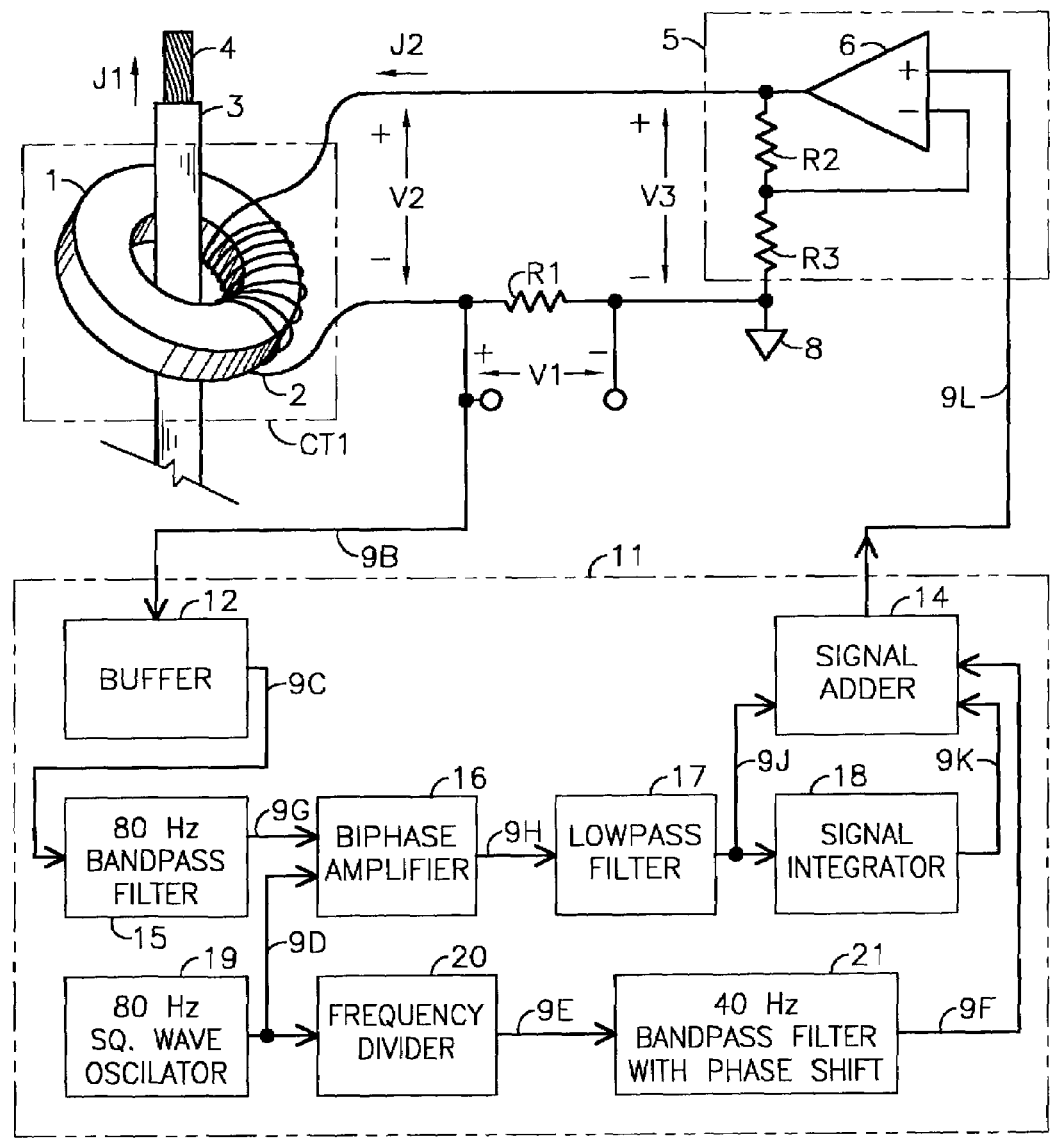
FIG. 7 shows a block diagram of a first embodiment of the invention.

FIG. 7 illustrates an embodiment of the invention that enables an ordinary current transformer to provide a secondary current that is proportional to a primary d-c current. By controlling magnetomotive force, buildup of magnetic flux is prevented and an ordinary current transformer can operate with a d-c primary current.

Figure 15:
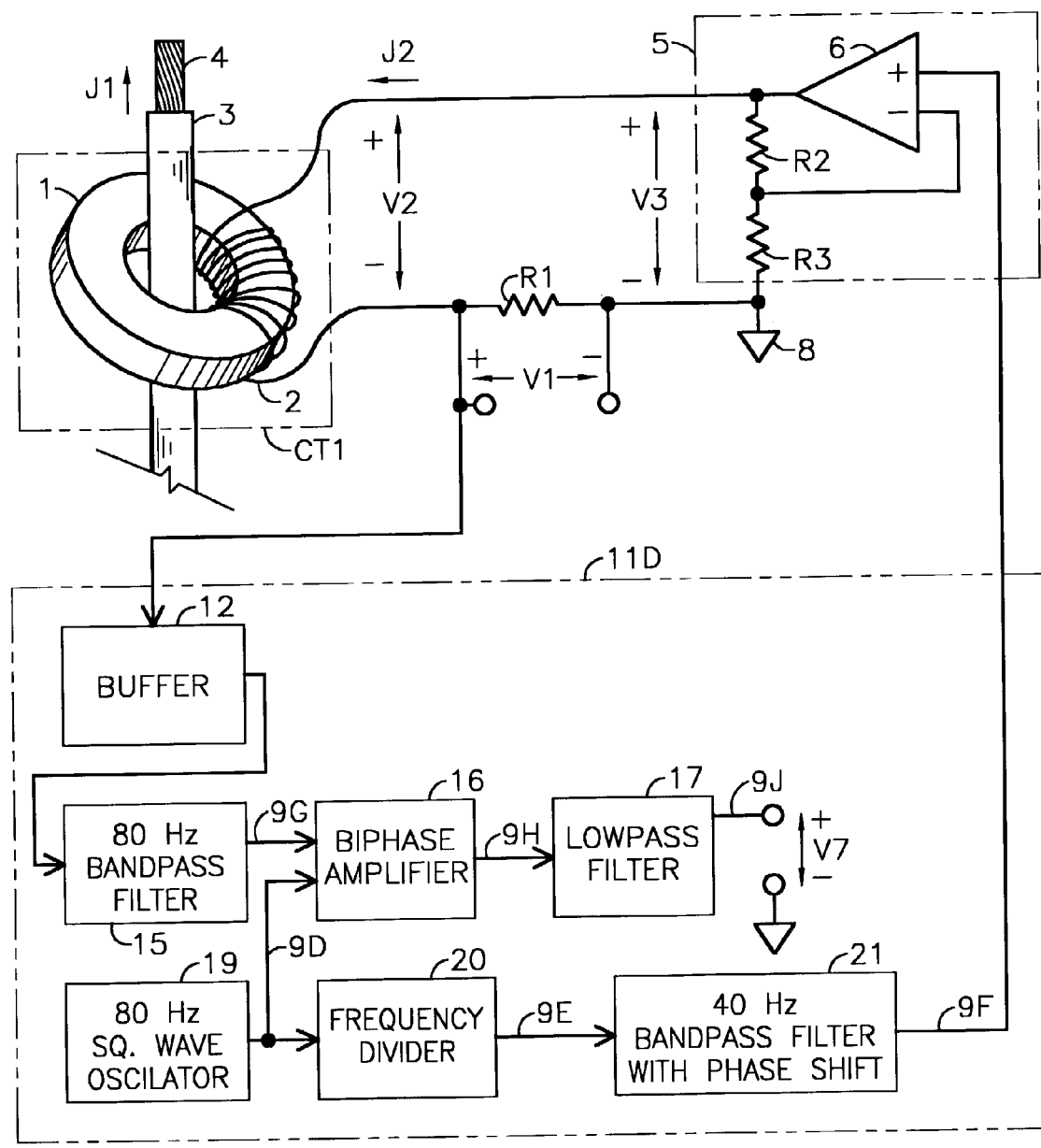
FIG. 15 is a simplified embodiment of the invention that operates in an open-loop configuration (no feedback) for measurement of slowly-changing magnetomotive force (or d-c primary current). The output of lowpass filter 17 is utilized directly as a measurement of magnetomotive force (or d-c primary current). This is an open-loop version of the invention that requires less operating power, but lacks the accuracy and range of the closed-loop versions.

While embodiment shown in FIG. 7 is intended to measure d-c current, it may be used to measure currents having alternating current components with frequencies slower than the predetermined frequency for excitation (which is 40 Hz. in FIG. 15). The practical frequency limit is dependent on properties of magnetic core 1, response characteristics of control circuit 11D, and, of course, the excitation frequency utilized. Using a faster excitation frequency is a simple way to extend the usable frequency range.

Current transformer CT1 is the same as shown in FIG. 1 and FIG. 3. Though a toroid is shown for magnetic core 1, current transformers have many different kinds of magnetic cores (the invention is applicable to virtually any kind of current transformer with any form of magnetic core, including split-core transformers if the effects of air gaps are minimized). The number of winding turns shown for secondary winding 2 is for illustration only, and may vary widely depending on the particular application. Current transformers are also available with wound primary windings or with bar-type primary configurations.

Similar to FIG. 3, a controllable voltage device 5 is connected in series with secondary winding 2. Voltage device 5 can be any kind of electrical energy source capable of producing a controllable output voltage in a current transformer secondary circuit. A simple embodiment of voltage device 5 is shown, comprising operational amplifier 6 and gain-control resistors R2 and R3. Similar to FIGS. 1, 2, and 3, secondary current J2 flows through current-sensing resistor R1, thereby producing voltage signal V1. Resistor R1 is a sensing means for sensing secondary electric current J2.

A control circuit 11 continuously causes voltage device 5 to produce an oscillating excitation voltage, and continuously senses dissymmetry of exciting current, and continuously adjusts output voltage V3 so as to minimize d-c current error, thereby causing secondary current J2 to be continuously proportional to primary current J1. Control circuit 11 may be referred to as a calculating means or a control means.

In the preferred embodiment, operational amplifier 6 is a power op amp, Burr-Brown model OPA548T. This device has an adjustable current-limit feature and is rated for up to three amps of continuous current (other models are available with higher ratings). A "snubber circuit" (not shown) should be connected to the output to improve stability (as recommended by the device's data sheet). A "snubber circuit" that has been successfully utilized is a ten ohm resistor in series with a 0.1 microfarad capacitor, connected between the operational amplifier output and the grounded conductor. An additional resistor (not shown) is necessary to set the current limit of the device, in accordance with the device's data sheet.

Voltage device 5 primarily needs to provide current gain, and a small voltage gain works well. The values chosen for resistors R2 and R3 are not critical. In the preferred embodiment resistor R3 is 2.0 kilohm, and resistor R2 is 200 ohms (causing voltage device 5 to have a voltage gain of about 1.1).

In the preferred embodiment, magnetic core 1 is a tape-wound core made with 7-mil grain-oriented silicon steel processed for minimum coercive force. The core has an internal diameter of 0.5 inch, an outside diameter of 1.5 inches, and a thickness of 0.5. Winding 2 is 110 turns of 26 AWG copper magnet wire, and has a winding resistance of about 0.9 ohms.

Current-sensing resistor R1 is rated 1.0 ohm in the preferred embodiment.

Control circuit 11 may be implemented with analog electronics or digital electronics, or a combination of the two. The function blocks shown in FIG. 7 are implemented with analog electronics in FIG. 8, but will first be discussed from a functional point of view.

An oscillator circuit comprises a square-wave oscillator 19, a frequency divider 20, and a bandpass filter 21. This oscillator circuit, together with voltage device 5, is an excitation means for causing magnetic flux in the magnetic body to oscillate at the predetermined frequency. 40 Hz. is a predetermined operating frequency for this control circuit. The frequency utilized is not critical, and has been chosen to minimize noise associated with the circuit and to not conflict with electric power system frequencies (50 or 60 Hz. and related harmonics).

Oscillator 19 produces a square-wave output having an 80 Hz. frequency, which is twice the predetermined frequency. This output is used as a control signal 9D to a biphase amplifier 16, and is also an input signal to frequency divider 20.

Frequency divider 20 provides a 40 Hz. square-wave signal 9E that is precisely half the frequency of signal 9D.

Bandpass filter 21 has a narrow bandpass characteristic set close to 40 Hz. This filter changes signal 9E from a square waveform to a sinusoidal waveform signal 9F, and adjusts the phase angle so that signal 9D (the biphase amplifier control signal) is timed properly relative to signal 9F. The magnitude of signal 9F is modified as it is passed through signal adder 14, and becomes one of several signal components in signal 9L and voltage V3. Signal 9F is a symmetrical excitation signal that causes an oscillation of magnetic flux in magnetic core 1, resulting in an exciting current component in secondary current J2.

In the preferred embodiment, the excitation voltage component of output voltage V3 does not drive magnetic body 1 into saturation. The preferred embodiment utilizes non-linearities in core permeability below saturation levels. The magnitude of excitation voltage required for good operation is dependent on core permeability characteristics, the core cross-sectional area, the number of winding turns, the excitation frequency, and the sensitivity of the second-harmonic detection circuits. Relatively small excitation voltage and low frequency are usually preferred to minimize noise coupled to the primary circuit. While the preferred embodiment utilizes an excitation frequency of only 40 Hz., some applications will benefit from utilizing much higher frequencies, such as 1000 Hz., 10,000 Hz., or even higher.

Secondary current J2 flowing through resistor R1 causes voltage V1 to be proportional to secondary current J2. Signal 9B is voltage V1, and is buffered by buffer 12, so that signal 9C is also equal to voltage V1. Buffer 12 may be deleted if bandpass filter 15 has sufficiently high input impedance so that voltage V1 is not adversely affected.

80 Hz. bandpass filter 15 amplifies the second harmonic of exciting current (relative to other frequency components) and produces signal 9G for input to biphase amplifier 16. It may also be said that bandpass filter 15 is used for "filtering" the second harmonic component.

Biphase amplifier 16 has a gain of plus or minus one, depending on the polarity of control signal 9D received from the oscillator circuit. Biphase amplifier 16 is used for detecting the magnitude and phase angle of the second harmonic component. Operation of biphase amplifier 16 is timed (by shifting the phase angle of signal 9F) so that the polarity of the gain is switched approximately at every zero-crossing point of the second harmonic component of exciting current. In this configuration, biphase amplifier 16 operates like a synchronous rectifier for the second harmonic component of exciting current. This causes signal 9H to have an average magnitude approximately proportional to the magnitude of the exciting current second harmonic component, with polarity corresponding to the phase angle of the second harmonic component.

Lowpass filter 17 smooths signal 9H so that signal 9J is approximately the average value of signal 9H.

Signal 9J has a strong correlation to the average magnetomotive force experienced by the magnetic core. For small values of magnetomotive force (for many types of magnetic bodies), signal 9J is approximately proportional to magnetomotive force. Signal 9J is a bipolar signal, with its polarity corresponding to the polarity of magnetomotive force. This known correlation may be further quantified for a particular configuration by performing simple tests (with the feedback loop open), and developing a graph similar to FIG. 16.

In FIG. 7, signal 9J is used as a feedback signal for a proportional plus integral type of control to minimize the average magnetomotive force. Signal 9J is fed back to the secondary circuit through signal adder 14 for proportional control. Signal integrator 18 integrates signal 9J, producing signal 9K, which is fed back via signal adder 14, thereby providing integral control. Signal integrator 18 (and signal 9k) may be omitted for some applications. It is included in the preferred embodiment to minimize error associated with the control loop.

Signal adder 14 may have different gains for each input signal. The instantaneous magnitude of signal 9L is therefore a weighted sum of the instantaneous magnitudes of signals 9F, 9J, and 9K. Signal adder 14, signal integrator 18, and voltage device 5 may be described as a control system that receives signal 9J as an information signal and that controls the magnetomotive force experienced by magnetic core 1.

Figure 8:
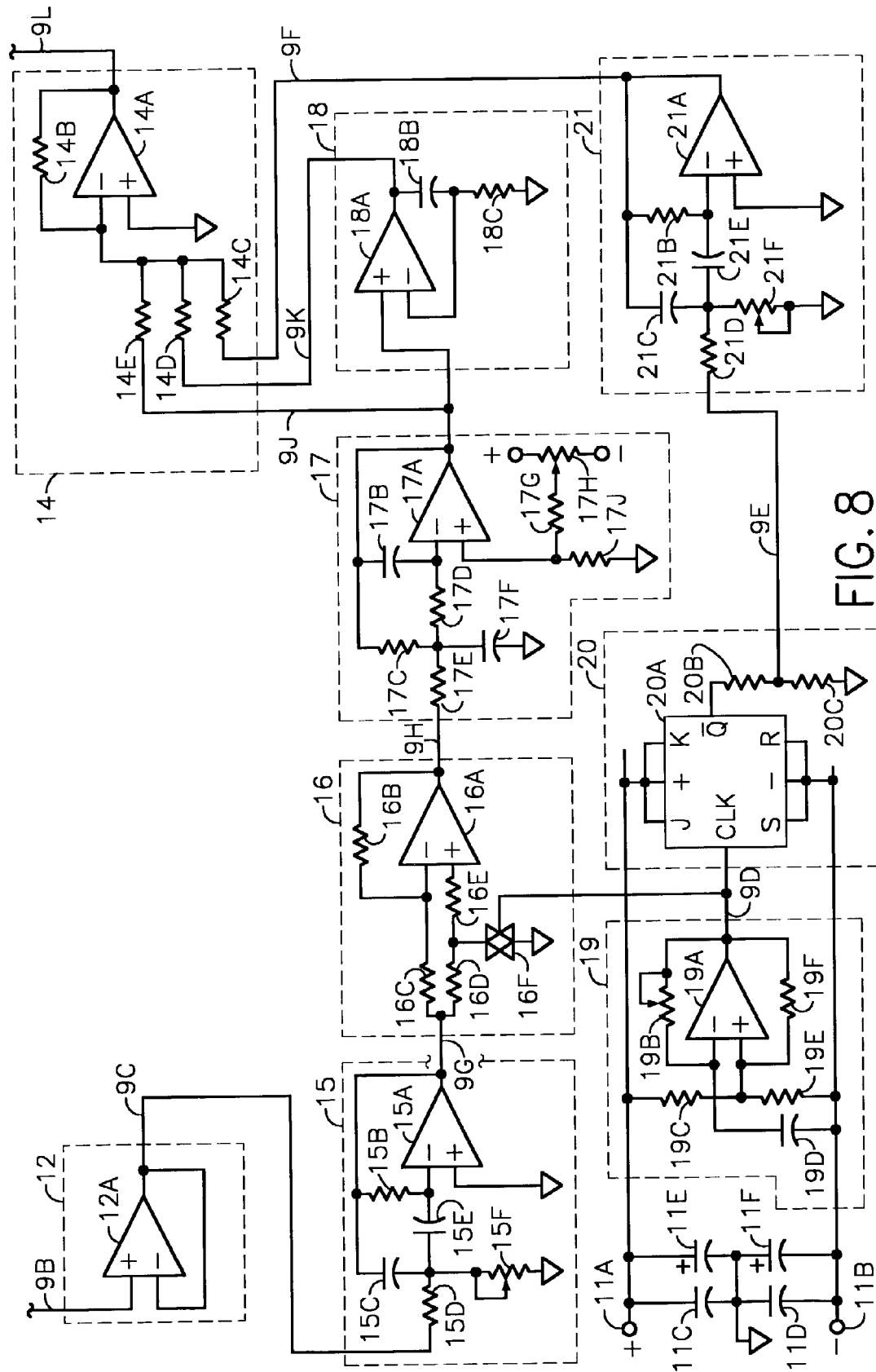
FIG. 8 is a detailed schematic diagram of the control circuit of FIG. 7.

FIG. 8 is a detailed schematic diagram showing a preferred embodiment of control circuit 11 in FIG. 7. The embodiment shown in FIG. 8 utilizes analog electronic calculating means. FIG. 8 shows just one of many possible embodiments of control circuit 11. Resistors critical to filter or timing functions should have 1% tolerance or better and have good temperature stability. Capacitors in filter or timing circuits should have 5% tolerance or better and have good temperature stability. All operational amplifiers utilized in control circuit 11 are Texas Instruments type TLO64ACN with JFET inputs.

A d-c power supply (not shown) provides operating power to terminals 11A and 11B, with positive voltage set to +6 volts and negative voltage set to −6 volts. Power supply connections to the operational amplifiers and analog switch 16F are not shown. Capacitors 11C, 11D, 11E, and 11F are included to reduce power supply noise. Capacitors 11C and 11D are rated 0.1 microfarad, and capacitors 11E, and 11F are electrolytic capacitors rated 10 microfarads.

Buffer 12 is simply an op amp 12A configured as a voltage follower, so that the output voltage is continuously the same as the input voltage.

Signal adder 14 is built around an op amp 14A. The output is an inverted weighted sum of the inputs. Component values are:

Resistor 14B: 27 kilohm
Resistor 14C: 470 kilohm
Resistor 14D: 1.0 megohm
Resistor 14E: 24 kilohm 80 Hz. bandpass filter 15 is built around an op amp 15A. The configuration shown inverts the input signal (the 80 Hz. component). Component values are:

Resistor 15B: 750 kilohm
Capacitor 15C: 0.10 microfarad
Resistor 15D: 10.0 kilohm
Capacitor 15E: 0.10 microfarad
Resistor 15F: variable to 1.0 kilohm (set for 80 Hz. bandpass operation with zero degrees phase shift at 80 Hz., approx. 720 ohms)

Biphase amplifier 16 is built around an op amp 16A. Component values are:

Resistor 16B: 20.0 kilohm
Resistor 16C: 20.0 kilohm
Resistor 16D: 20.0 kilohm
Resistor 16E: 20.0 kilohm
Switch 16F: An analog switch, Fairchild model MM74HC4066N (only one of four switches included is used).

When control signal 9D is high, switch 16F is closed, and biphase amplifier 16 inverts signal 9G. When control signal 9D is low, switch 16F is open and signal 9H is approximately equal to signal 9G (not inverted).

Lowpass filter 17 is built around an op amp 17A. The configuration shown inverts the input signal. Component values are:

Capacitor 17B: 0.10 microfarad
Resistor 17C: 1.00 megohm
Resistor 17D: 499 kilohm
Resistor 17E: 1.00 megohm
Capacitor 17F: 0.10 microfarad
Resistor 17G: 51 kilohm
Potentiometer 17H: 100 kilohm
Resistor 17J: 100 ohm Resistors 17G and 17J and potentiometer 17H are included for d-c offset correction of the operational amplifiers. Potentiometer 17H should be set so that secondary current J2 has an average value of zero when primary current J1 is zero.

Signal integrator 18 is built around an op amp 18A. This is a noninverting integrator that includes a proportional component in the output, as well as the integral of the input signal. Component values are:

Capacitor 18B: 1.0 microfarad
Resistor 18C: 240 kilohm

80 Hz. square-wave oscillator 19 is built around an op amp 19A. Component values are:

Resistor 19B: variable to 1.0 megohm (set for 80 Hz. output)
Resistor 19C: 49.9 kilohm
Capacitor 19D: 0.10 microfarad
Resistor 19E: 49.9 kilohm
Resistor 19F: 29.4 kilohm Frequency divider 20 is built around a type J-K set-reset flip-flop 20A (Fairchild model CD4027BCN, only one of two flip-flops is used). Component values are:

Resistor 20B: 10 kilohm
Resistor 20C: 1.0 kilohm

Resistors 20B and 20C function as a voltage divider.

40 Hz. bandpass filter 21 is built around an op amp 21A. The configuration shown inverts the input signal. Component values are:

Resistor 21B: 1.00 megohm
Capacitor 21C: 0.10 microfarad
Resistor 21D: 75.0 kilohm
Capacitor 21E: 0.10 microfarad
Resistor 21F: variable to 10 kilohm (set for approximately 40 Hz. bandpass operation and phase shift as described for FIG. 9F, approx. 1550 ohms)

FIG. 9A through FIG. 9L show waveforms associated with the control circuit of FIG. 7 and FIG. 8 (these waveforms are also applicable to some subsequent figures). Some of the waveforms shown are most easily observed in a test circuit by opening the feedback loop by disconnecting signals 9J and 9K from signal adder 14. Time references T2, T3, and T4 are included to facilitate comparison of the various waveforms. Time t increases from left to right for each waveform.

FIG. 9A shows primary current J1 as a d-c current.

FIG. 9B shows signal 9B, which is the same as voltage V1, which is proportional to secondary current J2. This is seen to be proportional to primary current J1 with an exciting current error added.

FIG. 9C shows signal 9C, which is the same as signal 9B.

FIG. 9D shows signal 9D, an 80 Hz. square wave.

FIG. 9E shows signal 9E, a 40 Hz. square wave synchronized with signal 9D.

FIG. 9F shows signal 9F, a 40 Hz. sinusoid which is inverted and phase-shifted somewhat relative to signal 9E. The amount of phase shift shown is approximately an amount required to align the zero crossing points of signal 9D with the zero crossing points of the second harmonic in signals 9B, 9C and 9G. Signal 9F becomes the excitation voltage component of output voltage V3 (after its amplitude is modified by signal adder 14 and voltage device 5). Its magnitude as a component of voltage V3 is preferably about 0.5 volts peak-to-peak. This causes a 40 Hz. sinusoidal noise signal on primary conductor 4 of less than 5 millivolts peak-to-peak.

FIG. 9G shows signal 9G, which is the output of the 80 Hz. bandpass filter. The waveform of this signal will show considerable variation depending on the magnitude and waveform of primary current J1. The signal shown has the second harmonic of exciting current amplified relative to other components of signal 9C.

FIG. 9H shows signal 9H, which is the output of biphase amplifier 16. Whenever signal 9D is high, signal 9G is inverted by the biphase amplifier. Signal 9H has an average value that depends on the magnitude and polarity of the second harmonic of the exciting current.

FIG. 9J shows signal 9J, which is approximately the average value of signal 9H.

FIG. 9K shows signal 9K, which is the integral of signal 9J.

FIG. 9L shows signal 9L, which is the weighted (and inverted) sum of signals 9F, 9J, and 9K. In the case shown, signal 9F dominates, and signal 9L looks much like signal 9F inverted.

FIG. 9M will be discussed below along with FIG. 10 and FIG. 11.

FIG. 9N will be discussed below along with FIG. 12.

Figure 10:
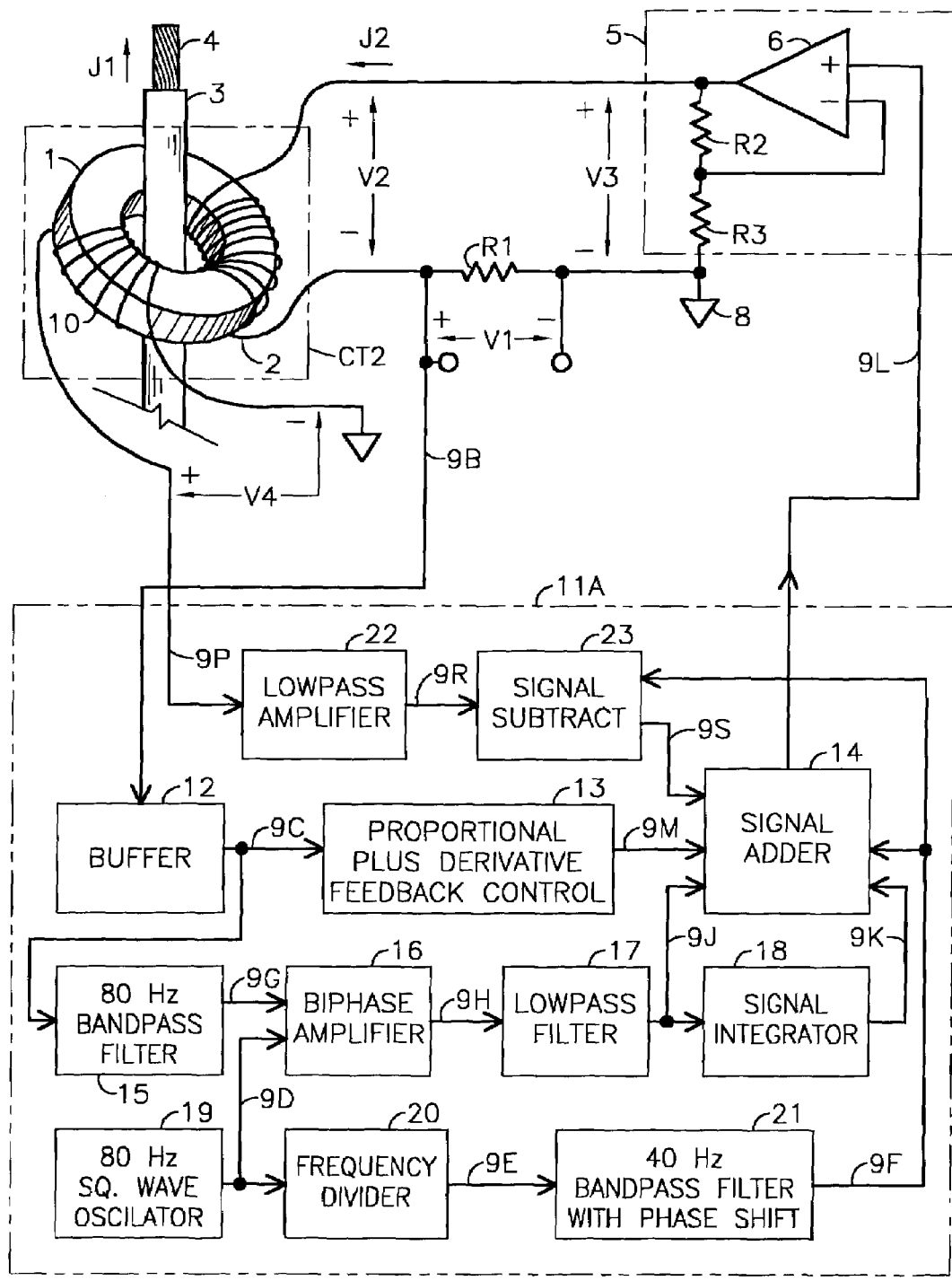
FIG. 10 is a block diagram of a second embodiment of the invention. This embodiment is similar to FIG. 7, but additionally includes two kinds of prior-art flux control methods to improve operation.

FIG. 10 is a variation of FIG. 7, in which two types of prior-art compensation methods are utilized: a "zero-flux" method and a "burden-reducing" method (discussed previously under "Background of the Invention" and for FIG. 2 and FIG. 3). Variations of the embodiment shown in FIG. 10 may include just one of these compensation methods, rather than both. By controlling magnetomotive force and reducing normal (but undesirable) flux oscillations, buildup of magnetic flux is prevented and an ordinary current transformer can operate with a-c and d-c primary currents.

The embodiment shown in FIG. 10 is well-suited to measuring a primary current having any combination of a-c and d-c components, including a primary current having one or more frequency components faster than the predetermined frequency (which is 40 Hz. in FIG. 10).

Most function blocks in control circuit 11A (in FIG. 10) are the same as in control circuit 11 in FIG. 8, and function the same as previously described. New function blocks include feedback control 13, lowpass amplifier 22, and signal subtracter 23.

The "burden-reducing" method is implemented by adding feedback control 13. Signal 9M has a component that is proportional to secondary current J2, and may optionally also have a component that is proportional to the rate of change of secondary current J2. The waveforms shown in FIG. 9A through FIG. 9L are applicable to FIG. 10. Additionally, FIG. 9M shows a waveform for signal 9M, which is approximately proportional to signal 9C, but inverted (the rate of change component is too small to be observed).

A "zero-flux" compensation method is implemented by adding sense winding 10 which develops voltage V4 which is proportional to the rate of change of flux in magnetic core 1. The preferred embodiment uses about 55 turns of 26 AWG copper magnet wire for winding 10. Current transformer CT2 is similar to current transformer CT1 except for this added sense winding. Signal 9P is the same as voltage V4.

A lowpass amplifier 22 receives and amplifies signal 9P and filters out high-frequency components, so that signal 9R is an amplified version of signal 9P without high-frequency components that may cause instability in the loop. Lowpass amplifier 22 has relatively high input impedance so that voltage V4 is not adversely affected.

A signal subtracter 23 subtracts signal 9F (the 40 Hz. excitation voltage required by the invention) from signal 9R, effectively subtracting the preferred 40 Hz. voltage induced in winding 10. Signal 9S is then proportional to the rate of change of unwanted flux changes. Signal 9S is amplified by signal adder 14 and fed back to the secondary circuit as part of signal 9L and voltage V3. In this way, unwanted flux changes due to changes in primary current J1 are further reduced, while allowing the 40-Hz. preferred flux oscillations to be unaffected.

By reducing undesirable changes in magnetic flux associated with normal current transformer operation, the configuration of FIG. 10 can operate with any combination of a-c and d-c currents.

Figure 11:
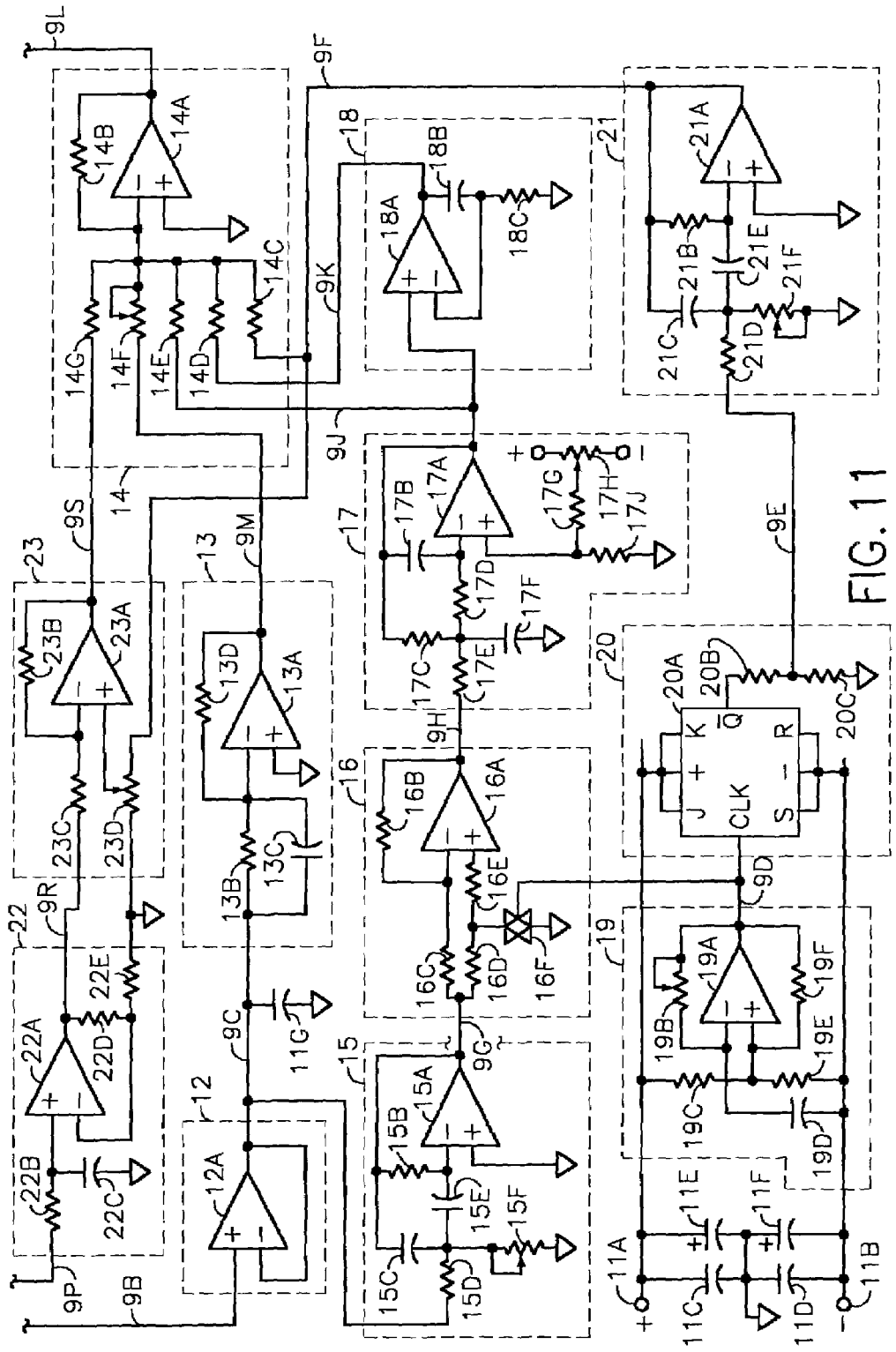
FIG. 11 shows a detailed schematic diagram of the control circuit of FIG. 10.

FIG. 11 shows a schematic diagram for control circuit 11A. Most parts are the same as FIG. 8, and function the same as previously described. New parts include feedback control 13, lowpass amplifier 22, and signal subtracter 23. Preferred embodiments are as follows:

All operational amplifiers shown in FIG. 11 are Texas Instruments type TLO64ACN with JFET inputs.

Feedback control 13 is built around an op amp 13A. Component values are:
  Resistor 13B: 10 kilohm
  Capacitor 13C: 1200 picofarad
  Resistor 13D: 15 kilohm
  Capacitor 11G: 100 picofarad Resistor 13B determines the amount of proportional feedback, and capacitor 13C determines the amount of derivative (rate-of-change) feedback. The ratio of capacitance to resistance of these two devices should correlate to the ratio of inductance to resistance of secondary loop impedances. Since secondary loop inductance is small compared to secondary loop resistance, derivative feedback is not critical to good operation (in the preferred embodiment), and capacitor 13C may be omitted. The 1200 picofarad rating of capacitor 13C is a very rough approximation of the amount of derivative feedback required for optimum operation.

Lowpass amplifier 22 is built around an op amp 22A. Component values are:
  Resistor 22B: 2.00 kilohm
  Capacitor 22C: 0.01 microfarad
  Resistor 22D: 32.4 kilohm
  Resistor 22E: 16.2 kilohm Signal subtracter 23 is built around an op amp 23A. Component values are:
  Resistor 23B: 20.0 kilohm
  Resistor 23C: 20.0 kilohm
  Potentiometer 23D: 50 kilohm Potentiometer 23D is configured as an adjustable voltage divider. It should be adjusted so that the 40 Hz. excitation signal (which is proportional to signal 9F) is subtracted accurately from signal 9R, resulting in signal 9S having little or no 40 Hz. component).

Resistors 14F and 14G are also new. Resistor 14G is rated 4.64 kilohm. Resistor 14F is variable to 50 kilohm. Variable resistor 14F should be set for best burden-reducing operation. With stray secondary loop resistances in the preferred embodiment approximately equal to 0.9 ohms (mostly secondary winding resistance), and a 1.0 ohm sensing resistor (R1), then loop gain for resistance compensation should be about (1.0+0.9)/1.0=1.9. Since feedback control 13 has a proportional gain of about 1.5 (15k/10k), and voltage device 5 has a gain of about 1.1, adder circuit 14 should have a gain of about 1.9/1.5/1.1=1.15 for signal 9M. Since resistor 14B is 27 kilohm, resistor 14F should be set to approximately 23.5 kilohm (for a gain of 27/23.5=1.15).

Figure 12:
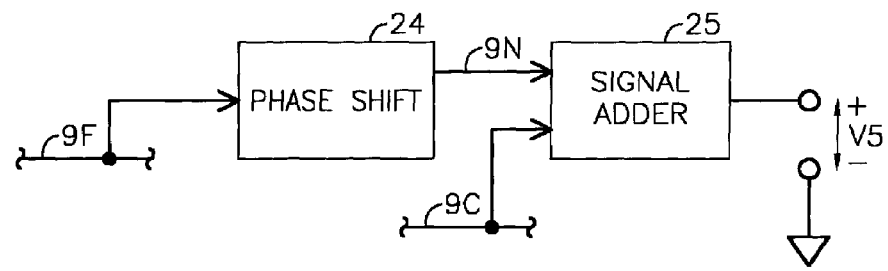
FIG. 12 illustrates how the exciting current error may be approximated and subtracted from the secondary current signal to provide a signal that is more accurately proportional to the primary current.

FIG. 12 illustrates how secondary current error due to 40 Hz. exciting current can be partially corrected. The exciting current error can be estimated and subtracted from a secondary current signal to produce a more accurate secondary current signal (or an inverted exciting current error can be added to a secondary current signal). One simple way to do this is to estimate an inverted exciting current error to be a 40 Hz. sinusoid proportional to signal 9F with a fixed phase angle change (this method does not correct for errors related to harmonic components of the exciting current error). A phase shift circuit 24 can be embodied as a bandpass filter similar to 40 Hz. bandpass filter 21 (detuned somewhat to cause the proper phase shift). Signal 9N is then approximately proportional to an inverted 40 Hz. component of exciting current (as shown in FIG. 9N). A signal adder 25 (similar to signal adder 14 of FIG. 8) is then used to adjust the magnitude of signal 9N and add it to signal 9C, thereby calculating a corrected signal V5 that is more accurately proportional to primary current J1 than is signal 9C (corrected signal V5 is a voltage signal that has almost the same waveform as primary current J1, which is shown in FIG. 9A).

Figure 13:
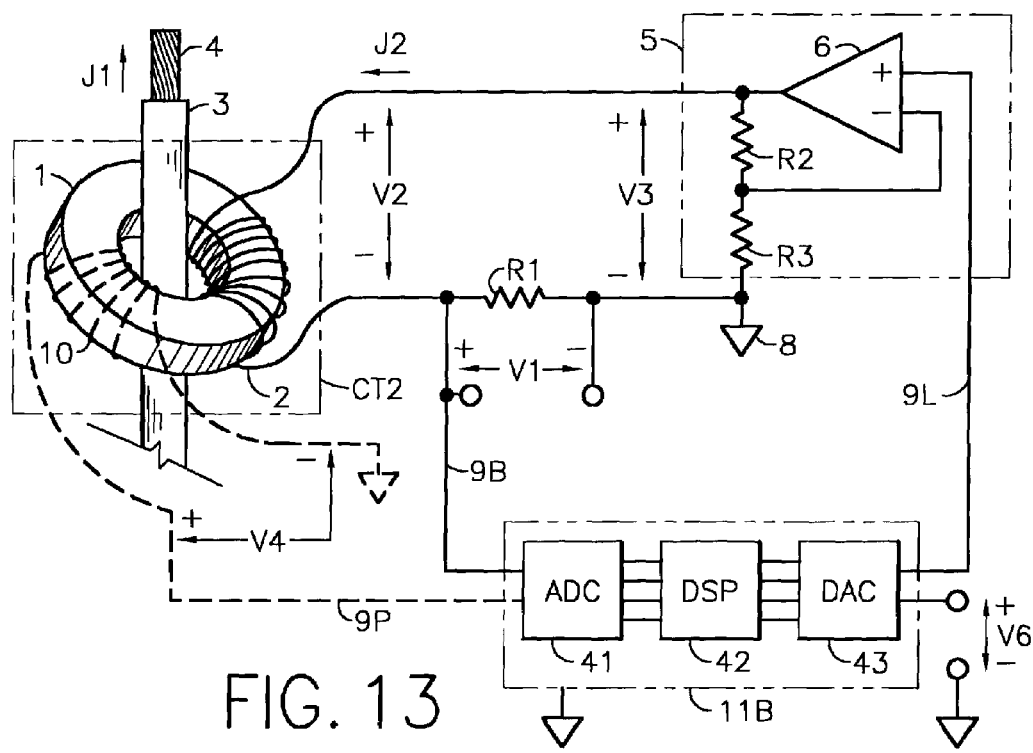
FIG. 13 shows an alternate embodiment utilizing a digital signal processor rather than analog electronics.

FIG. 13 shows an alternate embodiment of the invention utilizing digital electronic calculating means for a control circuit 11B. An analog-to-digital converter circuit 41 converts signal 9B into a digital signal for processing by a digital signal processor 42. If sense winding 10 is optionally included for better flux control, then analog-to-digital converter circuit 41 also converts signal 9P into a digital signal for processing by a digital signal processor 42.

Digital signal processor 42 digitally performs functions similar to the function blocks shown in FIG. 10 for control circuit 11A. A digital-to-analog circuit 43 converts a digital output signal from digital signal processor 42 and generates signal 9L, which is an analog signal similar to signal 9L in embodiments previously discussed. In this configuration voltage V1 may be used as an output signal, or a voltage signal V6 may be generated by control circuit 11B. Voltage signal V6 may include correction for exciting current error by programming digital signal processor 42 to include calculations similar to those described for FIG. 12.

Similar to FIG. 10, the embodiment shown in FIG. 13 is well-suited to measuring a primary current having any combination of a-c and d-c components, including a primary current having one or more frequency components faster than the predetermined frequency.

Figure 14:
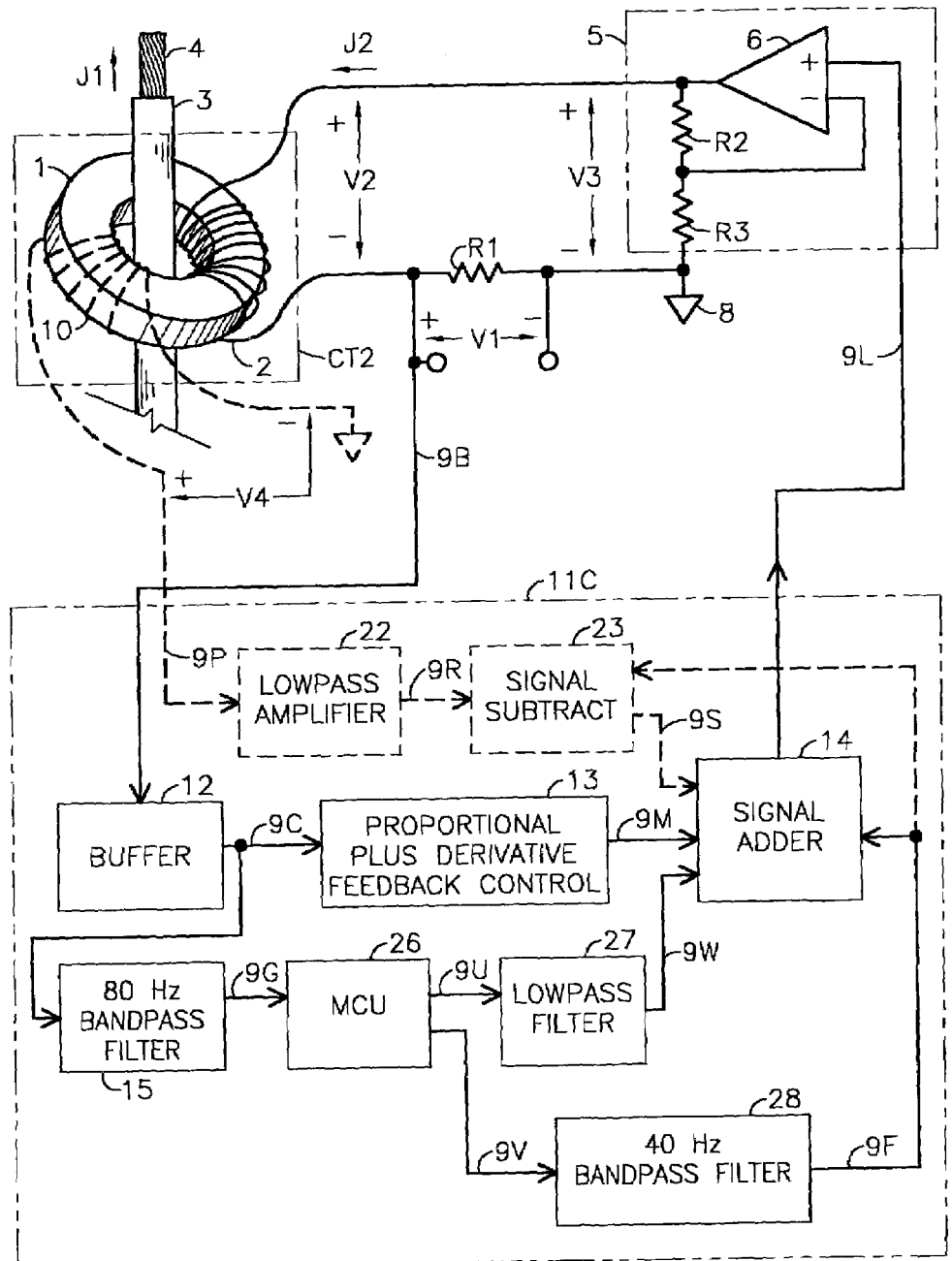
FIG. 14 shows how an inexpensive microcontroller may be combined with analog controls in another alternate embodiment of the invention.

FIG. 14 shows an alternate embodiment of the invention utilizing a combination of digital electronic calculating means and analog electronic calculating means for a control circuit 11C. The operation is similar to FIG. 10, except that a microcontroller circuit 26 performs the functions of several function blocks shown in FIG. 10. These function blocks include square-wave oscillator 19, frequency divider 20, biphase amplifier 16, lowpass filter 17, and signal integrator 18.

Microcontroller 26 receives signal 9G from 80 Hz. bandpass filter 15. An analog-to-digital converter integral to microcontroller 26 converts signal 9G into a digital signal for processing by microcontroller 26. Output signal 9U may be a pulse-width modulated output signal having an average value approximately correlating to the sum of signal 9J and signal 9K in FIG. 10. Lowpass filter 27 then filters signal 9U so that signal 9W is approximately equal to the sum of signal 9J and signal 9K in FIG. 10. Signal 9V is a 40 Hz. square wave similar to signal 9E of FIG. 10. Bandpass filter 28 smooths signal 9V into a sine wave to minimize noise. As in previous embodiments, the zero-flux controls associated with sense winding 10 are optional (these are shown with dashed lines).

Level shifter circuits may be required at the input and output of microcontroller 26 if the input and output of microcontroller 26 are not suitable for receiving and producing bipolar signals.

Similar to FIG. 10 and FIG. 13, the embodiment shown in FIG. 14 is well-suited to measuring a primary current having any combination of a-c and d-c components, including a primary current having one or more frequency components faster than the predetermined frequency.

FIG. 15 shows a simplified embodiment of the invention operating in an open-loop mode. A control circuit 11D serves primarily as a calculating means. Operation of FIG. 15 is similar to FIG. 7, except that (referring to FIG. 7) the feedback control loop has been opened by disconnecting signals 9J and 9K from signal adder 14. (Signal adder 14 is then no longer necessary and signal 9L becomes the same as signal 9F). In this configuration, the output of lowpass filter 17 (signal 9J or voltage V7) becomes a measure of the average magnetomotive force caused by primary current J1. Since average magnetomotive force is proportional to the d-c current component of current J1, voltage V7 may also be used as a measure of d-c current in conductor 4.

In addition to measuring d-c current, the configuration of FIG. 15 may be used to measure currents having alternating current components with frequencies slower than the predetermined frequency for excitation (which is 40 Hz. in FIG. 15). The practical frequency limit is dependent on properties of magnetic core 1, response characteristics of control circuit 11D, and, of course, the excitation frequency utilized.

Figure 16:
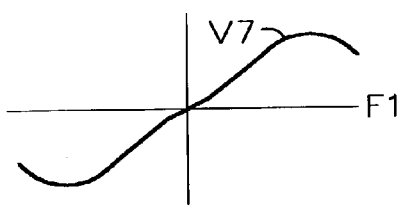
FIG. 16 shows an approximate response curve for the configuration shown in FIG. 15.

FIG. 16 shows a typical response curve for the configuration shown in FIG. 15. For this curve, current J1 is limited to d-c current, which is proportional to average magnetomotive force F1 experienced by magnetic core 1. Average magnetomotive force F1 varies linearly from negative values to positive values along the horizontal axis. The magnitude of voltage V7 is approximately proportional to the magnitude of the second harmonic component of exciting current. The polarity of voltage V7 correlates with the phase angle of the second harmonic component of exciting current.

FIG. 16 graphically shows a known relationship between magnetomotive force F1 and a difference of symmetry between excitation waveforms. In this case, the known relationship involves the magnitude and phase angle of a second harmonic component of exciting current when excitation voltage is symmetrical.

In the range between the positive and negative peaks of the response curve (shown in FIG. 16), the response curve is a known correlation between the average value of magnetomotive force and the magnitude of the second harmonic component of exciting current. Within this range, by utilizing the known correlation, the average magnitude of magnetomotive force (or d-c current) may be determined by measuring the magnitude of the second harmonic component of exciting current.

Still referring to FIG. 16, the response curve also indicates the polarity of the average magnetomotive force, the polarity of voltage V7 being derived from a known correlation to the phase angle of the second harmonic component of exciting current. Therefore, it may be said that the polarity of the average value of magnetomotive force has a known correlation to the phase angle of the second harmonic component of the exciting current. By utilizing this known correlation, the polarity of average magnetomotive force (or d-c current) may be determined by measuring the phase angle of the second harmonic component of exciting current.

Figure 17:
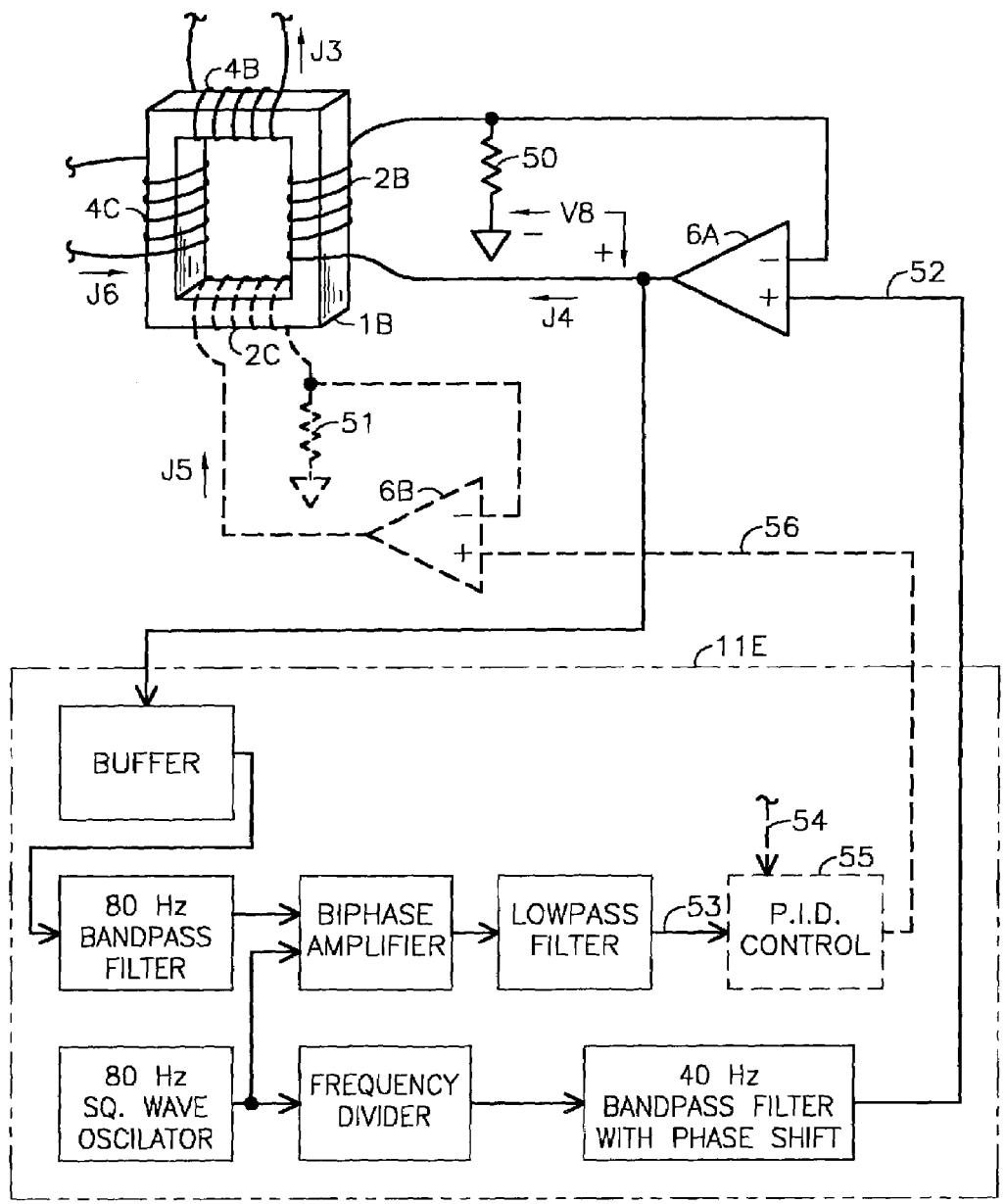
FIG. 17 shows an alternate embodiment intended to generalize some aspects of the invention.

FIG. 17 shows an alternate embodiment intended to generalize some aspects of the invention. FIG. 17 illustrates how current sources may be used in place of voltage sources, how an exciting means may utilize a dedicated winding separate from a control winding, how the invention may be applied to magnetic bodies other than magnetic cores of current transformers, and how a general-purpose Proportional plus Integral plus Derivative (PID) controller may be utilized with the invention.

In FIG. 17, a magnetic body 1B is magnetically coupled to four windings: a primary winding 4B, a secondary winding 4C, an excitation winding 2B, and a control winding 2C. Winding 4B conducts a current J3 as a result of being connected to a related system. Winding 4C conducts a current J6 also as a result of being connected to a related system. The difference in amp-turns of currents J3 and J6 cause magnetic core 1B to experience an average magnetomotive force that may not equal zero. The present invention utilizes excitation winding 2C and control winding 2D to control the average magnetomotive force so that the operation of magnetic core 1B is optimized for the related system. The principles described below are applicable for any number of windings coupled to the magnetic core (not just two windings (4B and 4C) as shown).

In FIG. 17, the feedback components are not required if magnetomotive force is only to be measured (but not controlled). Feedback components that may be deleted are indicated with dashed lines, and include a PID controller 55, an operational amplifier 6B, a resistor 51, and a control winding 2C. If these components are deleted, then operation is almost identical to FIG. 15, except that the excitation means utilizes a current source (rather than a voltage source), and it is the dissymmetry of the excitation voltage that is measured to determine magnetomotive force (rather than dissymmetry of exciting current).

A control circuit 11E is a calculating means, and is similar to previous control circuits, except that it may utilize a general-purpose PID controller 55, and may have two output signals instead of one. PID controller 55 receives signal 53 as an information signal containing information about the average value of magnetomotive force. PID controller 55 may be configured to maintain magnetomotive force at a fixed setpoint, or it may have an input signal 54 from a separate system and operate with a variable setpoint.

The configuration of FIG. 17 utilizes two current sources to control the average magnetomotive force experienced by magnetic body 1B. An operational amplifier 6A and resistor 50 are configured as a current source and are part of an exciting means. Control circuit 11E provides a symmetrical oscillating voltage signal 52, which is converted to a symmetrical oscillating current J4 by op amp 6A. This results in a voltage V8, which is an input signal to control circuit 11E (a direct connection to the output of op amp 6A is a sensing means for sensing voltage V8). The waveform symmetry of voltage V8 is dependent on the average magnitude and polarity of magnetomotive force. Voltage V8 is the sum of the excitation voltage and voltage drops associated with exciting current flowing through stray impedances. Since the stray impedances are generally linear (and since the exciting current is symmetrical), the voltage drops have symmetrical waveforms and do not contribute to the dissymmetry of the waveform of voltage V8. Therefore, any even harmonic components present in voltage V8 are due to the excitation voltage. Control circuit 11E processes this unsymmetrical signal in a similar manner as previously describe for other control circuits.

PID controller 55 controls a second current source comprising an operational amplifier 6B and resistor 51. A voltage signal 56 from PID controller 55 is converted to a current J5 that is proportional to voltage signal 56. Current J5 directly adds or subtracts from the magnetomotive force to maintain the average magnetomotive force at the setpoint of PID controller 55.

Finally, for purposes of clarifying the claims, the word "apparatus" has its usual meaning: a set of material or equipment designed for a particular use.

While several embodiments have been described and illustrated, there are many other embodiments possible that will be apparent to those skilled in the art. It is not the intent of this disclosure to limit the invention to the embodiments that have been illustrated. The components and configurations utilized in this disclosure are intended to be illustrative only, and are not intended to limit the scope of the appended claims.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

I claim:

1. A method for measuring a magnetomotive force experienced by a magnetic body; said magnetic body having a nonlinear permeability; said method comprising the steps of:
   (a) provide a first winding magnetically coupled to said magnetic body;
   (b) provide an excitation means for causing a magnetic flux in said magnetic body to oscillate at a predetermined frequency; said excitation means connected to said first winding; the operation of said excitation means resulting in an exciting current flowing in said first winding and an excitation voltage induced in said first winding; said exciting current oscillating at said predetermined frequency; said excitation voltage oscillating at said predetermined frequency; said exciting current having a first waveform, and said excitation voltage having a second waveform; a difference of symmetry between said first waveform and said second waveform being dependent on the magnitude and polarity of said magnetomotive force and on said nonlinear permeability;
   (c) utilizing predetermined symmetry relationships, determine said magnetomotive force from characteristics of one or both of said first waveform and said second waveform.

2. The method of claim 1 wherein said second waveform is symmetrical, and a dissymmetry of said first waveform is dependent on the magnitude and polarity of said magnetomotive force.

3. The method of claim 2 wherein said dissymmetry is characterized by said first waveform containing one or more even harmonic components of said predetermined frequency; the magnitude of said magnetomotive force having a known first correlation to the magnitude of one or more of said even harmonic components, the polarity of said magnetomotive force having a known second correlation to the phase angle of one or more of said even harmonic components; said magnetomotive force being determined by measuring one or more of said even harmonic components and utilizing said first correlation and said second correlation.

4. The method of claim 1 wherein said first waveform is symmetrical, and a dissymmetry of said second waveform is dependent on the magnitude and polarity of said magnetomotive force.

5. The method of claim 4 wherein said dissymmetry is characterized by said second waveform containing one or more even harmonic components of said predetermined frequency; the magnitude of said magnetomotive force having a known first correlation to the magnitude of one or more of said even harmonic components, the polarity of said magnetomotive force having a known second correlation to the phase angle of one or more of said even harmonic components; said magnetomotive force being determined by measuring one or more of said even harmonic components and utilizing said first correlation and said second correlation.

6. The method of claim 1 wherein a magnetic field has a known correlation to said difference of symmetry, and said method is used to measure said magnetic field.

7. The method of claim 1 wherein said magnetic flux has a known correlation to said difference of symmetry, and said method is used to measure said magnetic flux.

8. The method of claim 1 wherein said magnetomotive force is associated with a primary winding that is magnetically coupled to said magnetic body, said primary winding conducting a primary electric current, said magnetomotive force being approximately proportional to said primary electric current, and said method is used to measure said primary electric current.

9. The method of claim 8 wherein said primary electric current is a d-c current.

10. The method of claim 8 wherein said primary electric current has alternating current components having frequencies slower than said predetermined frequency.

11. The method of claim 1 wherein said excitation means does not drive said magnetic body to saturation.

12. The method of claim 1 wherein said method comprises the additional step of producing an information signal containing information about said magnetomotive force; said information signal being utilized by a control system to control said magnetomotive force.

13. The method of claim 12 wherein said control system functions to keep the average value of said magnetomotive force near zero.

14. The method of claim 12 further including the step of utilizing said control system to prevent buildup of said magnetic flux; said excitation means comprising a voltage source producing an output voltage; said control system controlling said voltage source so that said output voltage has a d-c component that causes a d-c current to flow in said winding, said d-c current having polarity and magnitude so as to reduce said magnetomotive force, thereby preventing buildup of said magnetic flux.

15. The method of claim 14 wherein said magnetic body is a magnetic core of a current transformer, said winding is a secondary winding of said current transformer and is conducting a secondary electric current, a primary electric current having a d-c component is flowing in a conductor configured as a primary winding of said current transformer, and said method is used to cause said secondary electric current to be approximately proportional to said primary electric current.

16. The method of claim 12 further including the step of utilizing said control system to prevent buildup of said magnetic flux; said control system controlling the magnitude and polarity of an electric current flowing in a second winding; said second winding being magnetically coupled to said magnetic body; said control system causing said electric current to have polarity and magnitude so as to reduce said magnetomotive force, thereby preventing buildup of said magnetic flux.

17. Apparatus for measuring a magnetomotive force experienced by a magnetic body; said magnetic body having a nonlinear permeability; said apparatus comprising:
(a) a first winding magnetically coupled to said magnetic body;
(b) an excitation means for causing a magnetic flux in said magnetic body to oscillate at a predetermined frequency without causing saturation of said magnetic body; said excitation means connected to said first winding; the operation of said excitation means resulting in an exciting current flowing in said first winding and an excitation voltage induced in said first winding; said exciting current oscillating at said predetermined frequency; said excitation voltage oscillating at said predetermined frequency; said exciting current having a first waveform, and said excitation voltage having a second waveform; a difference of symmetry between said first waveform and said second waveform being dependent on the magnitude and polarity of said magnetomotive force and on said nonlinear permeability;
(c) a sensing means for sensing one or both of said first waveform and said second waveform;
(d) a calculating means for calculating said magnetomotive force from said difference of symmetry; said calculating means utilizing one or more known relationships between said difference of symmetry and said magnetomotive force to calculate said magnetomotive force.

18. The apparatus of claim 17 wherein said excitation means is a voltage source providing an oscillating output voltage having a symmetrical waveform; said first waveform being unsymmetrical whenever the magnitude of said magnetomotive force is not approximately zero; said difference of symmetry being characterized by said first waveform containing one or more even harmonic components of said predetermined frequency; the magnitude of said magnetomotive force having a known first correlation to the magnitude of one or more of said even harmonic components, the polarity of said magnetomotive force having a known second correlation to the phase angle of one or more of said even harmonic components; said calculating means determining said magnetomotive force by measuring one or more of said even harmonics and utilizing said first correlation and said second correlation; said calculating means further producing an information signal indicating the polarity and approximate magnitude of said magnetomotive force.

19. The apparatus of claim 18 wherein
said sensing means comprises a current-sensing resistor connected in series with said secondary electric current, a first voltage signal across said current-sensing resistor being proportional to said exciting current;
said calculating means comprises a bandpass filter means for filtering a second harmonic component, a biphase amplifier means for detecting the magnitude and phase angle of said second harmonic component, a lowpass filter means for smoothing the output of said biphase amplifier means; an oscillator means for providing an oscillating voltage signal and for providing a control signal to said biphase amplifier; and
said voltage source comprises an operational amplifier;
said bandpass filter means receiving said first voltage signal and producing a second voltage signal having said second harmonic component amplified relative to other components of said first voltage signal;
said biphase amplifier means receiving said control signal and receiving said second voltage signal and producing a third voltage signal, the average value of said third voltage signal having magnitude approximately proportional to the magnitude of said second harmonic component and having polarity corresponding to the phase angle of said second harmonic component;
said lowpass filter receiving said third voltage signal and producing a fourth voltage signal approximately proportional to the average value of said third voltage signal; said fourth voltage signal being said information signal;
said oscillating means producing a fifth voltage signal oscillating at said predetermined frequency, and producing said control signal oscillating at twice said predetermined frequency;
said excitation means receiving said fifth voltage signal and producing said output voltage, said output voltage being approximately proportional to said fifth voltage signal.

20. The apparatus of claim 17 wherein said excitation means is a current source providing an oscillating output current having a symmetrical waveform; said second waveform being unsymmetrical whenever the magnitude of said magnetomotive force is not approximately zero; said difference of symmetry being characterized by said second waveform containing one or more even harmonic components of said predetermined frequency; the magnitude of said magnetomotive force having a known first correlation to the magnitude of one or more of said even harmonic components, the polarity of said magnetomotive force having a known second correlation to the phase angle of one or more of said even harmonic components; said calculating means determining said magnetomotive force by measuring one or more of said even harmonics and utilizing said first correlation and said second correlation; said calculating means further producing an information signal indicating the polarity and approximate magnitude of said magnetomotive force.

21. The apparatus of claim 20 wherein
said sensing means measures a first voltage, which is an output voltage of said current source, said first voltage containing said one or more even harmonic components of said excitation voltage;
said calculating means comprises a bandpass filter means for filtering a second harmonic component, a biphase amplifier means for detecting the magnitude and phase angle of said second harmonic component, a lowpass filter means for smoothing the output of said biphase amplifier means; an oscillator means for providing an oscillating voltage signal and for providing a control signal to said biphase amplifier; and
said current source comprises an operational amplifier;
said bandpass filter means receiving said first voltage signal and producing a second voltage signal having said second harmonic component amplified relative to other components of said first voltage signal;
said biphase amplifier means receiving said control signal and receiving said second voltage signal and producing a third voltage signal, the average value of said third voltage signal having magnitude approximately proportional to the magnitude of said second harmonic component and having polarity corresponding to the phase angle of said second harmonic component;

said lowpass filter receiving said third voltage signal and producing a fourth voltage signal approximately proportional to the average value of said third voltage signal;

said fourth voltage signal being said information signal;

said oscillating means producing a fifth voltage signal oscillating at said predetermined frequency, and producing said control signal oscillating at twice said predetermined frequency;

said excitation means receiving said fifth voltage signal and producing said output voltage, said output voltage being approximately proportional to said fifth voltage signal.

22. A method for continuously providing a secondary electric current that is proportional to a primary electric current; said primary electric current having a d-c component; said method comprising the steps of:

(a) provide a current transformer and cause said primary electric current to flow in a conductor configured as a primary winding of said current transformer; said current transformer comprising a magnetic core and a secondary winding magnetically coupled to said magnetic core; said magnetic core having a nonlinear permeability; said secondary electric current flowing in said secondary winding; said secondary electric current being approximately proportional to said primary electric current; said secondary electric current being proportionally smaller than said primary electric current by a turns ratio of said current transformer; an induced voltage in said secondary winding being proportional to a rate of change of a magnetic flux in said magnetic core; a secondary electric current error being proportional to a magnetomotive force acting on said magnetic core, an instantaneous value of said magnetomotive force being equal to an instantaneous difference between said primary electric current multiplied by the number of turns of said primary winding and said secondary electric current multiplied by the number of turns of said secondary winding; said secondary electric current error comprising a d-c component and an a-c component; said d-c component herein referred to as a d-c current error, said a-c component herein referred to as an exciting current error;

(b) connect a controllable voltage device in series with said secondary winding; said voltage device providing an output voltage that controls said induced voltage, thereby controlling said rate of change of said magnetic flux;

(c) continuously control said voltage device so that said induced voltage oscillates at a predetermined frequency, thereby causing said magnetic flux to oscillate at said predetermined frequency; said exciting current error thereby also being caused to oscillate at said predetermined frequency; a dissymmetry of said exciting current error being dependent on the magnitude and polarity of said d-c current error and said nonlinear permeability;

(d) continuously detect said dissymmetry;

(e) based on characteristics of said dissymmetry, continuously adjust said output voltage so as to minimize said d-c current error, thereby causing said secondary electric current to be approximately proportional to said primary electric current.

23. The method of claim 22 wherein said method further comprises the step of:

(f) control said output voltage to include a component that is proportional to said secondary electric current, thereby reducing changes in said magnetic flux caused by normal current transformer operation, thereby causing said secondary electric current to be more accurately proportional to said primary electric current, and thereby enabling said method to be utilized with said primary electric current having one or more frequency components faster than said predetermined frequency.

24. The method of claim 23 wherein said method further comprises the step of:

(g) control said output voltage to include a component that is proportional to the rate of change of said secondary electric current, thereby further reducing changes in said magnetic flux caused by normal current transformer operation, thereby causing said secondary electric current to be more accurately proportional to said primary electric current.

25. The method of claim 24 wherein said method further comprises the steps of:

(h) provide a third winding magnetically coupled to said magnetic core and terminate said third winding in a high-impedance manner so that a third voltage, measurable across said third winding, is approximately proportional to said rate of change of said magnetic flux, said third voltage therefore being proportional to said induced voltage;

(i) continuously sense said third voltage;

(j) utilize said third voltage to continuously determine undesirable changes in said magnetic flux, and continuously control said output voltage to reduce said undesirable changes, thereby causing said secondary electric current to be more accurately proportional to said primary electric current.

26. The method of claim 22 wherein said method further comprises the steps of:

(f) provide a third winding magnetically coupled to said magnetic core and terminate said third winding in a high-impedance manner so that a third voltage, measurable across said third winding, is approximately proportional to said rate of change of said magnetic flux, said third voltage therefore being proportional to said induced voltage;

(g) continuously sense said third voltage;

(h) utilize said third voltage to continuously determine undesirable changes in said magnetic flux, and continuously control said output voltage to reduce said undesirable changes, thereby causing said secondary electric current to be more accurately proportional to said primary electric current, and thereby enabling said method to be utilized with said primary electric current having one or more frequency components faster than said predetermined frequency.

27. The method of claim 22 wherein said method is utilized without causing said magnetic core to saturate.

28. The method of claim 22 wherein said dissymmetry is characterized by said exciting current containing one or more even harmonic components of said predetermined frequency; the magnitude of said magnetomotive force having a known first correlation to the magnitude of one or more of said even harmonic components, the polarity of said magnetomotive force having a known second correlation to the phase angle of one or more of said even harmonic components; said magnetomotive force being determined by measuring one or more of said even harmonic components and utilizing said first correlation and said second correlation.

29. The method of claim 22 further comprising the steps of:
   (f) continuously calculate an estimate of said exciting current error based on oscillations of said output voltage at said predetermined frequency and a known correlation between said exciting current and said output voltage;
   (g) continuously calculate a corrected signal as said secondary electric current minus said estimate of said exciting current error; said corrected signal being more accurately proportional to said primary electric current than is said secondary electric current.

30. The method of claim 22 wherein said voltage device is controlled utilizing analog electronic calculating means.

31. The method of claim 22 wherein said voltage device is controlled utilizing digital electronic calculating means.

32. The method of claim 22 wherein said voltage device is controlled utilizing a combination of analog electronic calculation means and digital electronic calculating means.

33. Apparatus for enabling a current transformer to continuously provide a secondary electric current that is proportional to a primary electric current, said primary electric current having a d-c component;
   said current transformer comprising a magnetic core and a secondary winding magnetically coupled to said magnetic core; said magnetic core having a nonlinear permeability; said secondary electric current flowing in said secondary winding; the magnitude of said secondary electric current being approximately proportional to said primary electric current; said secondary electric current being proportionally smaller than said primary electric current by a turns ratio of said current transformer; an induced voltage in said secondary winding being proportional to a rate of change of a magnetic flux in said magnetic core;
   a secondary electric current error being proportional to a magnetomotive force acting on said magnetic core, an instantaneous value of said magnetomotive force being equal to an the instantaneous difference between said primary electric current multiplied by the number of turns of said primary winding and said secondary electric current multiplied by the number of turns of said secondary winding; said secondary electric current error comprising a d-c component and an a-c component; said d-c component herein referred to as a d-c current error, said a-c component herein referred to as an exciting current error;
   said apparatus comprising:
   (a) a sensing means for sensing said secondary electric current and providing an information signal containing information about said exciting current error;
   (b) a controllable voltage means for producing an output voltage that controls said induced voltage, thereby controlling said rate of change of said magnetic flux; said controllable voltage device being connected in series with said secondary winding;
   (c) a control means for receiving said information signal and controlling said voltage means;
   said control means controlling said output voltage so that said induced voltage oscillates at a predetermined frequency, thereby causing said magnetic flux to oscillate at said predetermined frequency and causing said exciting current error to oscillate at said predetermined frequency; a dissymmetry of said exciting current error being dependent on the magnitude and polarity of said d-c current error and said nonlinear permeability; said control means continuously detecting said dissymmetry, and, based on characteristics of said dissymmetry, continuously adjusting said output voltage so as to minimize said d-c current error, thereby causing said secondary electric current to be approximately proportional to said primary electric current.

34. The apparatus of claim 33 wherein said control means further controls said voltage means so that said output voltage includes a component that is proportional to said secondary electric current, thereby reducing changes in said magnetic flux caused by normal current transformer operation, and thereby enabling said method to be utilized with said primary electric current having frequency components faster than said predetermined frequency.

35. The apparatus of claim 34 wherein said control means further controls said voltage means so that said output voltage includes a component that is proportional to the rate of change of said secondary electric current, thereby further reducing changes in said magnetic flux caused by normal current transformer operation.

36. The apparatus of claim 35 wherein said apparatus further comprises a third winding magnetically coupled to said magnetic core; said third winding being terminated in a high-impedance manner so that a third voltage measurable across said third winding is approximately proportional to said rate of change of said magnetic flux, said third voltage therefore being proportional to said induced voltage; said third winding being connected to said control means; said control means utilizing said third voltage as a feedback signal to improve the control of said induced voltage, thereby further reducing changes in said magnetic flux caused by normal current transformer operation.

37. The apparatus of claim 33 wherein said apparatus further comprises a third winding magnetically coupled to said magnetic core; said third winding being terminated in a high-impedance manner so that a third voltage measurable across said third winding is approximately proportional to said rate of change of said magnetic flux, said third voltage therefore being proportional to said induced voltage; said third winding being connected to said control means; said control means utilizing said third voltage as a feedback signal to improve the control of said induced voltage, thereby further reducing changes in said magnetic flux caused by normal current transformer operation, and thereby enabling said method to be utilized with said primary electric current having frequency components faster than said predetermined frequency.

38. The apparatus of claim 33 wherein said control means further controls said voltage means so that said magnetic core does not saturate.

39. The apparatus of claim 33 wherein said control means detects said dissymmetry by measuring the magnitude and phase angle of one or more even harmonic components of said exciting current error, said exciting current error being measurable as part of said secondary electric current; the magnitude of said d-c current error having a first correlation to the magnitude of one or more of said even harmonics, the polarity of said d-c current error having a second correlation to the phase angle of one or more of said even harmonics.

40. The apparatus of claim 39 wherein
   (a) said sensing means comprises a current-sensing resistor connected in series with said secondary electric current, a first voltage signal across said current-sensing resistor being proportional to said secondary electric current;
(b) said control means comprises a bandpass filter means for filtering a second harmonic component of said exciting current error, a biphase amplifier means for detecting the magnitude and phase angle of said second harmonic component, a lowpass filter means for smoothing the output of said biphase amplifier means, an integrator means for integrating the output of said lowpass filter, an oscillator means for providing an oscillating voltage signal and for providing a control signal to said biphase amplifier; and an adding means for adding signals; and
(c) said voltage means comprises an operational amplifier;
said bandpass filter means receiving said first voltage signal and producing a second voltage signal having said second harmonic component amplified relative to other components of said first voltage signal;
said biphase amplifier means receiving said control signal and receiving said second voltage signal and producing a third voltage signal, the average value of said third voltage signal having magnitude approximately proportional to the magnitude of said second harmonic component and having polarity corresponding to the phase angle of said second harmonic component;
said lowpass filter receiving said third voltage signal and producing a fourth voltage signal approximately proportional to the average value of said third voltage signal;
said integrator means receiving said fourth voltage signal and producing a fifth voltage signal approximately proportional to the integral of said fourth voltage signal;
said oscillating means producing a sixth voltage signal oscillating at said predetermined frequency, and producing said control signal oscillating at twice said predetermined frequency;
said adding means receiving said fourth voltage signal and said fifth voltage signal and said sixth voltage signal and producing a seventh voltage signal, said seventh voltage signal being approximately equal to said fourth voltage signal multiplied by a first constant plus said fifth voltage signal multiplied by a second constant plus said sixth voltage signal multiplied by a third constant;
said voltage means receiving said seventh voltage signal and producing said output voltage, said output voltage being approximately proportional to said seventh voltage signal.

* * * * *